US012635243B2

(12) United States Patent
Suzuki et al.

(10) Patent No.: US 12,635,243 B2
(45) Date of Patent: May 19, 2026

(54) ACTIVE MATRIX SUBSTRATE

(71) Applicant: Sharp Display Technology Corporation, Kameyama City (JP)

(72) Inventors: Masahiko Suzuki, Kameyama City (JP); Tetsuo Kikuchi, Kameyama City (JP); Setsuji Nishimiya, Kameyama City (JP); Kengo Hara, Kameyama City (JP); Hitoshi Takahata, Kameyama City (JP); Tohru Daitoh, Kameyama City (JP)

(73) Assignee: SHARP DISPLAY TECHNOLOGY CORPORATION, Kameyama City (JP)

( * ) Notice: Subject to any disclaimer, the term of this patent is extended or adjusted under 35 U.S.C. 154(b) by 712 days.

(21) Appl. No.: 17/973,790

(22) Filed: Oct. 26, 2022

(65) Prior Publication Data

US 2023/0135065 A1    May 4, 2023

Related U.S. Application Data

(60) Provisional application No. 63/274,281, filed on Nov. 1, 2021.

(51) Int. Cl.
*H10D 86/60* (2025.01)
*H10D 86/40* (2025.01)

(52) U.S. Cl.
CPC .......... *H10D 86/60* (2025.01); *H10D 86/441* (2025.01)

(58) Field of Classification Search
CPC ............... H10D 86/60; H10D 30/6734; H10D 86/441; H10D 30/6755; H10D 86/423;
(Continued)

(56) References Cited

U.S. PATENT DOCUMENTS

2008/0035920 A1    2/2008   Takechi et al.
2012/0138922 A1    6/2012   Yamazaki et al.
(Continued)

FOREIGN PATENT DOCUMENTS

JP      2008-040343 A    2/2008
JP      2012-134475 A    7/2012
(Continued)

*Primary Examiner* — Mouloucoulaye Inoussa
(74) *Attorney, Agent, or Firm* — Keating & Bennett, LLP

(57) ABSTRACT

An active matrix substrate includes a substrate, a plurality of oxide semiconductor TFTs each including an oxide semiconductor layer, a lower gate electrode positioned on the substrate side of the oxide semiconductor layer, and an upper gate electrode positioned on the oxide semiconductor layer on a side opposite from the substrate, a plurality of source wiring lines extending in a column direction, a plurality of upper gate wiring lines extending in a row direction, and a plurality of lower gate wiring lines extending in the row direction. The plurality of lower gate wiring lines include a first gate wiring line, and the plurality of upper gate wiring lines include a second gate wiring line partially overlapping the first gate wiring line via the lower gate insulating layer and the upper gate insulating layer. The plurality of oxide semiconductor TFTs include a first TFT including an oxide semiconductor layer extending across the first gate wiring line and the second gate wiring line in the column direction, when viewed from a normal direction of the substrate. Portions of the first gate wiring line and the second gate wiring line, over which the oxide semiconductor layer of the first TFT extends, respectively function as the lower gate electrode and the upper gate electrode of the first TFT. When viewed from the normal direction of the substrate, the first gate wiring line includes a plurality of first notched portions disposed spaced apart from each other and a first solid portion, the first solid portion being a portion other than the plurality of first notch portions. When viewed from the
(Continued)

normal direction of the substrate, the second gate wiring line includes a second solid portion including a plurality of first overlapping portions disposed spaced apart from each other, each of the first overlapping portions partially overlapping at least one of the plurality of first notched portions, and a second overlapping portion overlapping the first solid portion. When viewed from the normal direction of the substrate, the second overlapping portion continuously extends from one of two of the plurality of source wiring lines adjacent to each other, to the other of the two source wiring lines adjacent to each other.

20 Claims, 37 Drawing Sheets

(58) Field of Classification Search
CPC .......... H10D 30/6723; G02F 1/136286; G02F 1/1368; G02F 1/136209; G02F 1/13685; G02F 1/136295; G02F 1/134363; G02F 1/13606; G02F 1/136227; G02F 1/134372; G02F 2202/10; G02F 2201/123; G02F 2201/121; H10K 59/131; G09G 3/3648; G09G 3/3677; G09G 2300/0495; G09G 2300/0413; G09G 2300/0408; G09G 2300/0895; G09G 2300/0452; G09G 2310/0281

See application file for complete search history.

(56) References Cited

U.S. PATENT DOCUMENTS

| | | | |
|---|---|---|---|
| 2013/0320334 A1 | 12/2013 | Yamazaki et al. | |
| 2014/0286076 A1 | 9/2014 | Aoki et al. | |
| 2018/0059473 A1 | 3/2018 | Uchida | |
| 2020/0089037 A1* | 3/2020 | Yoshino | G02F 1/13338 |
| 2020/0089038 A1* | 3/2020 | Yoshino | G06F 3/0445 |
| 2020/0089064 A1* | 3/2020 | Morinaga | G02F 1/1368 |
| 2020/0089069 A1* | 3/2020 | Morinaga | H10K 59/1213 |
| 2020/0233275 A1* | 7/2020 | Morinaga | H10D 86/441 |
| 2021/0043656 A1* | 2/2021 | Hara | G02F 1/134363 |
| 2021/0200008 A1* | 7/2021 | Morinaga | G02F 1/13394 |
| 2021/0200045 A1* | 7/2021 | Morinaga | G09G 3/3648 |

FOREIGN PATENT DOCUMENTS

| | | |
|---|---|---|
| JP | 2014-007399 A | 1/2014 |
| JP | 2014-209727 A | 11/2014 |
| JP | 2018-036315 A | 3/2018 |

\* cited by examiner

ACTIVE MATRIX SUBSTRATE

CROSS-REFERENCE TO RELATED APPLICATIONS

This application claims the benefit of priority to U.S. Provisional Application No. 63/274,281 filed on Nov. 1, 2021. The entire contents of the above-identified application are hereby incorporated by reference.

BACKGROUND

Technical Field

The disclosure relates to active matrix substrates.

Display devices have been widely used each of which includes an active matrix substrate provided with switching elements for respective pixels. An active matrix substrate provided with thin film transistors (hereinafter referred to as "TFTs") as the switching elements is referred to as a TFT substrate. Note that, in the present specification, a portion of the TFT substrate corresponding to a pixel of the display device is referred to as a pixel area or a pixel. Additionally, the TFT provided as the switching element for each pixel of the TFT substrate is referred to as a "pixel TFT".

It has been proposed in recent years to use an oxide semiconductor layer as an active layer of the TFT in place of an amorphous silicon layer or a polycrystalline silicon layer. Such a TFT is referred to as an "oxide semiconductor TFT". The oxide semiconductor has a higher mobility than amorphous silicon. Thus, the oxide semiconductor TFT can operate at a higher speed than the amorphous silicon TFT. Further, since the oxide semiconductor layer is formed by a process simpler than that for the amorphous silicon layer, the oxide semiconductor layer can be applied to a device that requires a large area.

While many oxide semiconductor TFTs are bottom gate structure TFTs, top gate structure oxide semiconductor TFTs have been proposed as well. In the top gate structure, a gate electrode is disposed on a part of the oxide semiconductor layer with a gate insulating layer interposed therebetween. Further, a structure may be adopted in which light is shielded on a substrate side of a channel region of the oxide semiconductor layer.

JP 2018-36315 A proposes a structure in which a shield wiring line is disposed on the substrate side of a semiconductor layer of a pixel TFT in an active matrix substrate, and the shield wiring line is electrically connected to a scanning line (gate bus line) in an upper layer overlying the semiconductor layer. In this way, the pixel TFT having a double gate structure is formed. Note that, in the present specification, a structure in which the gate electrodes are disposed on both the substrate side of the semiconductor layer and the side opposite from the substrate is referred to as a "double gate structure". Further, the gate electrode disposed on the substrate side of an active layer is referred to as a "lower gate electrode", and the gate electrode disposed on the active layer is referred to as an "upper gate electrode".

SUMMARY

As examined by the present inventor, in the active matrix substrate disclosed in JP 2018-36315 A, there is a possibility that parasitic capacitance (overlap capacitance) formed by the shield wiring line and the scanning line may increase.

An embodiment of the disclosure provides an active matrix substrate including an oxide semiconductor TFT that has a double gate structure and can reduce parasitic capacitance.

The present specification discloses active matrix substrates described in the following items.

Item 1

An active matrix substrate includes a display region including a plurality of pixel areas disposed in a matrix shape in a row direction and a column direction.

The active matrix substrate includes a substrate, a plurality of oxide semiconductor TFTs supported on a main surface of the substrate and corresponding to the plurality of pixel areas, each of the plurality of oxide semiconductor TFTs including an oxide semiconductor layer, a lower gate electrode positioned on the substrate side of the oxide semiconductor layer and overlapping a part of the oxide semiconductor layer via a lower gate insulating layer, and an upper gate electrode positioned on the oxide semiconductor layer on a side opposite from the substrate and overlapping the part of the oxide semiconductor layer via an upper gate insulating layer, a plurality of source wiring lines extending in the column direction;

a plurality of upper gate wiring lines extending in the row direction, and a plurality of lower gate wiring lines positioned between the plurality of upper gate wiring lines and the substrate and extending in the row direction.

The plurality of lower gate wiring lines include a first gate wiring line.

The plurality of upper gate wiring lines include a second gate wiring line partially overlapping the first gate wiring line via the lower gate insulating layer and the upper gate insulating layer.

The plurality of oxide semiconductor TFTs include a first TFT, the oxide semiconductor layer of the first TFT extending across the first gate wiring line and the second gate wiring line in the column direction, when viewed from a normal direction of the substrate, and portions of the first gate wiring line and the second gate wiring line, over which the oxide semiconductor layer of the first TFT extends, respectively functioning as the lower gate electrode and the upper gate electrode of the first TFT.

When viewed from the normal direction of the substrate, the first gate wiring line includes a plurality of first notched portions disposed spaced apart from each other and a first solid portion, the first solid portion being a portion other than the plurality of first notched portions.

When viewed from the normal direction of the substrate, the second gate wiring line includes a second solid portion including a plurality of first overlapping portions disposed spaced apart from each other, each of the first overlapping portions partially overlapping at least one of the plurality of first notched portions, and a second overlapping portion overlapping the first solid portion.

When viewed from the normal direction of the substrate, the second overlapping portion continuously extends from one of two of the plurality of source wiring lines adjacent to each other, to the other of the two source wiring lines adjacent to each other.

Item 2

The active matrix substrate according to item 1, in which, when viewed from the normal direction of the substrate, the oxide semiconductor layer of the first TFT extends across the column direction between two of the first notched portions adjacent to each other in the first gate wiring line.

Item 3

The active matrix substrate according to item 1 or 2, in which, when viewed from the normal direction of the substrate, at least one of the plurality of first overlapping portions of the second gate wiring line includes a portion positioned between the two adjacent source wiring lines.

Item 4

The active matrix substrate according to any one of items 1 to 3, in which, when viewed from the normal direction of the substrate, the first solid portion of the first gate wiring line includes a first edge portion and a second edge portion extending in the row direction while facing each other, the second solid portion of the second gate wiring line includes a third edge portion and a fourth edge portion extending in the row direction while facing each other, the third edge portion of the second gate wiring line extends, in the row direction, across the plurality of first notched portions of the first gate wiring line, and the fourth edge portion extends, in the row direction, between the first edge portion and the second edge portion of the first gate wiring line, between the two adjacent source wiring lines.

Item 5

The active matrix substrate according to any one of items 1 to 4, in which, when viewed from the normal direction of the substrate, an edge portion of each of the first notched portions of the first gate wiring line includes an inclined portion extending in a direction intersecting the row direction and the column direction, the inclined portion intersecting an edge portion of the second solid portion of the second gate wiring line.

Item 6

The active matrix substrate according to any one of items 1 to 5, in which, when viewed from the normal direction of the substrate, a maximum length in the column direction of each of the first notched portions of the first gate wiring line is from ¼ to ¾ of a maximum width in the column direction of the first solid portion of the first gate wiring line.

Item 7

The active matrix substrate according to any one of items 1 to 6, in which, when viewed from the normal direction of the substrate, a length in the row direction of an interval between two of the first notched portions adjacent to each other of the first gate wiring line is greater than a channel width of the first TFT and no more than twice the channel width.

Item 8

The active matrix substrate according to any one of items 1 to 7, in which, between the two adjacent source wiring lines, a maximum width of the second solid portion of the second gate wiring line is smaller than a maximum width of the first solid portion of the first gate wiring line.

Item 9

The active matrix substrate according to any one of items 1 to 8, in which, when viewed from the normal direction of the substrate, the second gate wiring line further includes a plurality of second notched portions disposed spaced apart from each other, and a portion other than the plurality of second notched portions is the second solid portion.

Item 10

The active matrix substrate according to item 9, in which, one of the plurality of second notched portions at least partially overlaps one of the plurality of first notched portions of the first gate wiring line.

Item 11

The active matrix substrate according to item 9, in which, one of the plurality of second notched portions is adjacent, in the column direction, to one of the plurality of first notched portions of the first gate wiring line with the second overlapping portion interposed therebetween.

Item 12

The active matrix substrate according to any one of items 9 to 11, in which, when viewed from the normal direction of the substrate, the second solid portion of the second gate wiring line includes a third edge portion and a fourth edge portion extending in the row direction while facing each other, and when viewed from the normal direction of the substrate, the plurality of second notched portions include at least one notched portion positioned inside a recessed portion formed at the third edge portion, and at least one notched portion positioned inside a recessed portion formed at the fourth edge portion.

Item 13

The active matrix substrate according to any one of items 1 to 12, in which, when viewed from the normal direction of the substrate, the first solid portion of the first gate wiring line includes a first edge portion and a second edge portion extending in the row direction while facing each other, and when viewed from the normal direction of the substrate, each of the plurality of first notched portions is positioned inside a recessed portion formed at either one of the first edge portion or the second edge portion.

Item 14

The active matrix substrate according to item 13, in which, when viewed from a normal direction of the substrate, the plurality of first notched portions include at least one notched portion positioned inside a recessed portion formed at the first edge portion, and at least one notched portion positioned inside a recessed portion formed at the second edge portion.

Item 15

The active matrix substrate according to any one of items 1 to 14, in which, the active matrix substrate further includes a non-display region positioned around the display region, the non-display region includes a plurality of gate wiring line connection sections supported on the substrate, and each of the gate wiring line connection sections electrically connects one of the plurality of lower gate wiring lines and one of the plurality of upper gate wiring lines.

Item 16

The active matrix substrate according to item 15, in which, in each of the gate wiring line connection sections, one of the plurality of lower gate wiring lines and one of the plurality of upper gate wiring lines are electrically connected via a connection electrode formed in an upper layer overlying the plurality of upper gate wiring lines.

Item 17

The active matrix substrate according to item 15 or 16, in which the plurality of gate wiring line connection sections include a pair of first gate wiring line connection sections electrically connecting the first gate wiring line and the second gate wiring line, and when viewed from a normal direction of the substrate, the pair of first gate wiring line connection sections are positioned respectively on both sides of the display region in the row direction.

Item 18

The active matrix substrate according to any one of items 1 to 17, in which the oxide semiconductor layer contains In, Ga, and Zn.

5

Item 19

The active matrix substrate according to item 18, in which the oxide semiconductor layer includes an In—Ga—Zn—O-based oxide.

Item 20

The active matrix substrate according to item 19, in which the In—Ga—Zn—O-based oxide includes a crystalline portion.

According to an embodiment of the disclosure, an active matrix substrate is provided that includes an oxide semiconductor TFT that has a double gate structure and can reduce a parasitic capacitance.

BRIEF DESCRIPTION OF DRAWINGS

The disclosure will be described with reference to the accompanying drawings, wherein like numbers reference like elements.

6

Figure 10A:
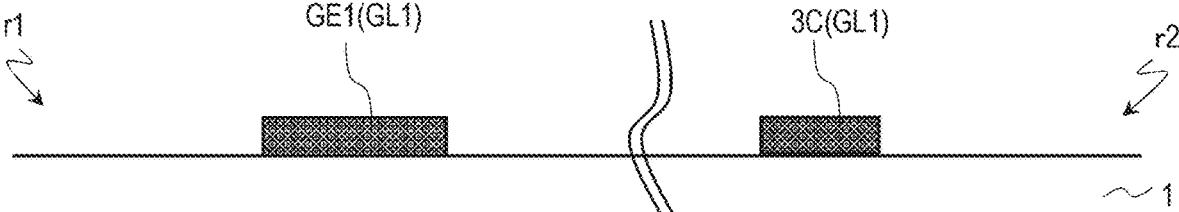
FIG. 10A is a process cross-sectional view illustrating an example of a method for manufacturing the active matrix substrate 101.
Figure 10B:
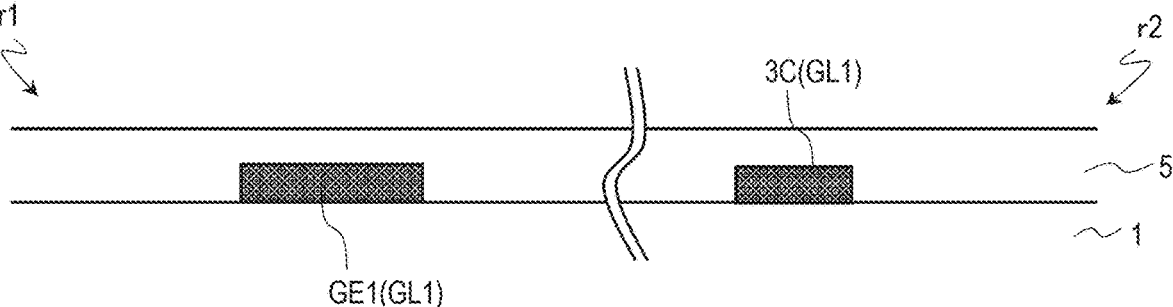
FIG. 10B is a process cross-sectional view illustrating the example of the method for manufacturing the active matrix substrate 101.
Figure 10C:
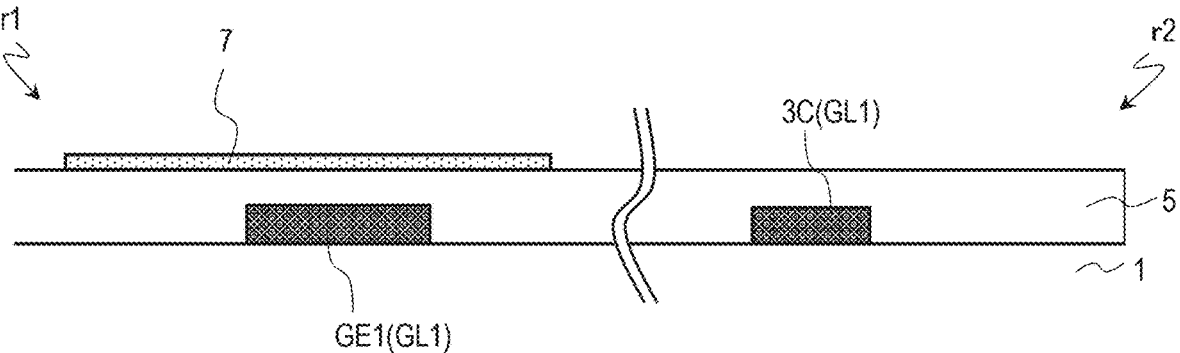

FIG. 10C is a process cross-sectional view illustrating the example of the method for manufacturing the active matrix substrate 101.

Figure 10D:
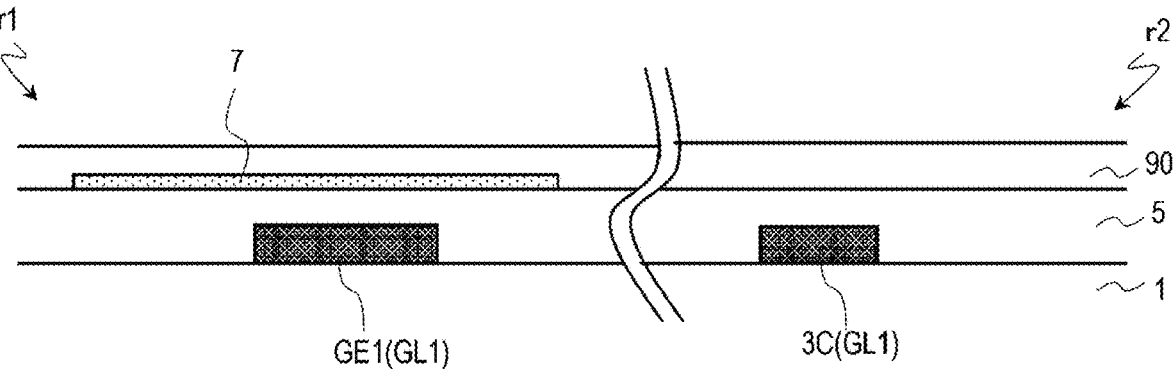

FIG. 10D is a process cross-sectional view illustrating the example of the method for manufacturing the active matrix substrate 101.

Figure 10E:
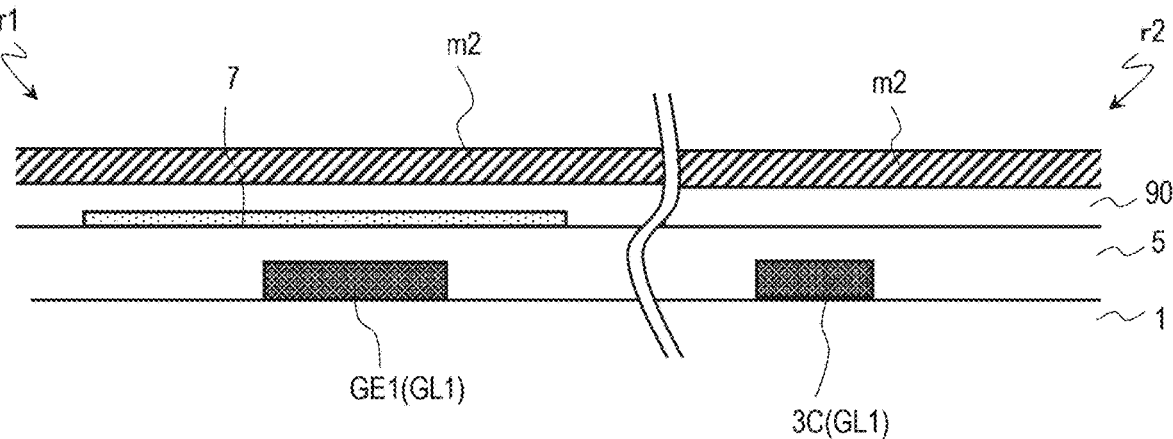

FIG. 10E is a process cross-sectional view illustrating the example of the method for manufacturing the active matrix substrate 101.

Figure 10F:
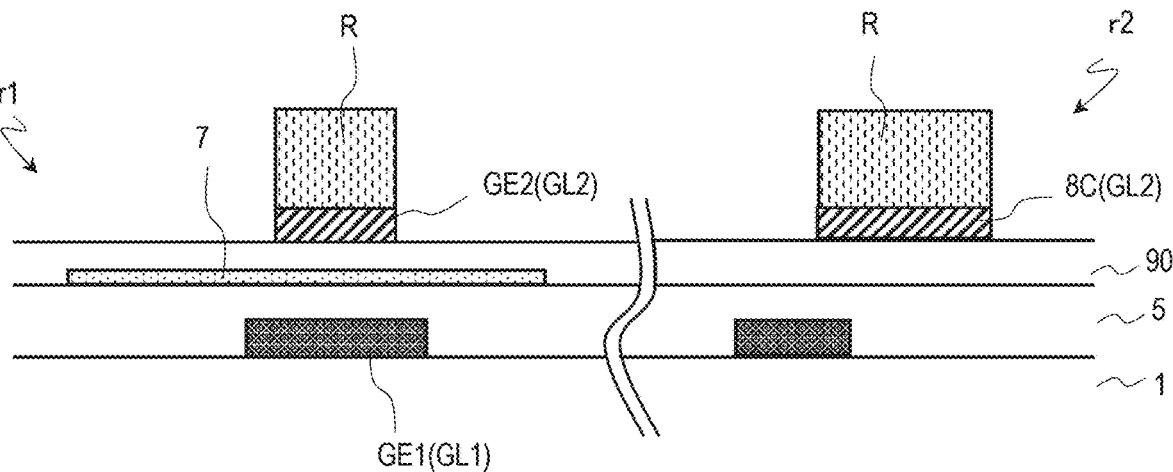

FIG. 10F is a process cross-sectional view illustrating the example of the method for manufacturing the active matrix substrate 101.

Figure 10G:
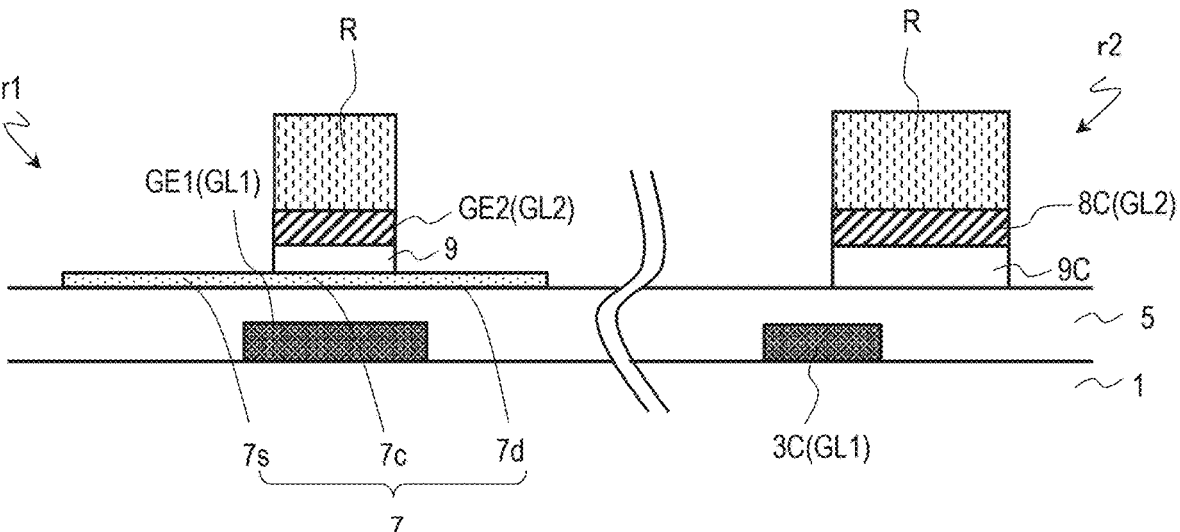

FIG. 10G is a process cross-sectional view illustrating the example of the method for manufacturing the active matrix substrate 101.

Figure 10H:
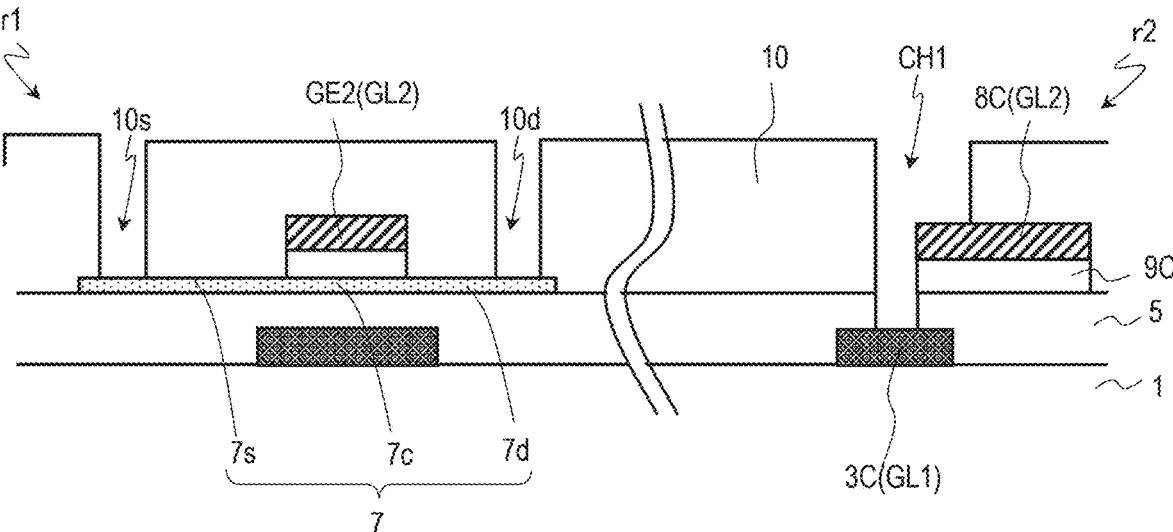

FIG. 10H is a process cross-sectional view illustrating the example of the method for manufacturing the active matrix substrate 101.

Figure 10I:
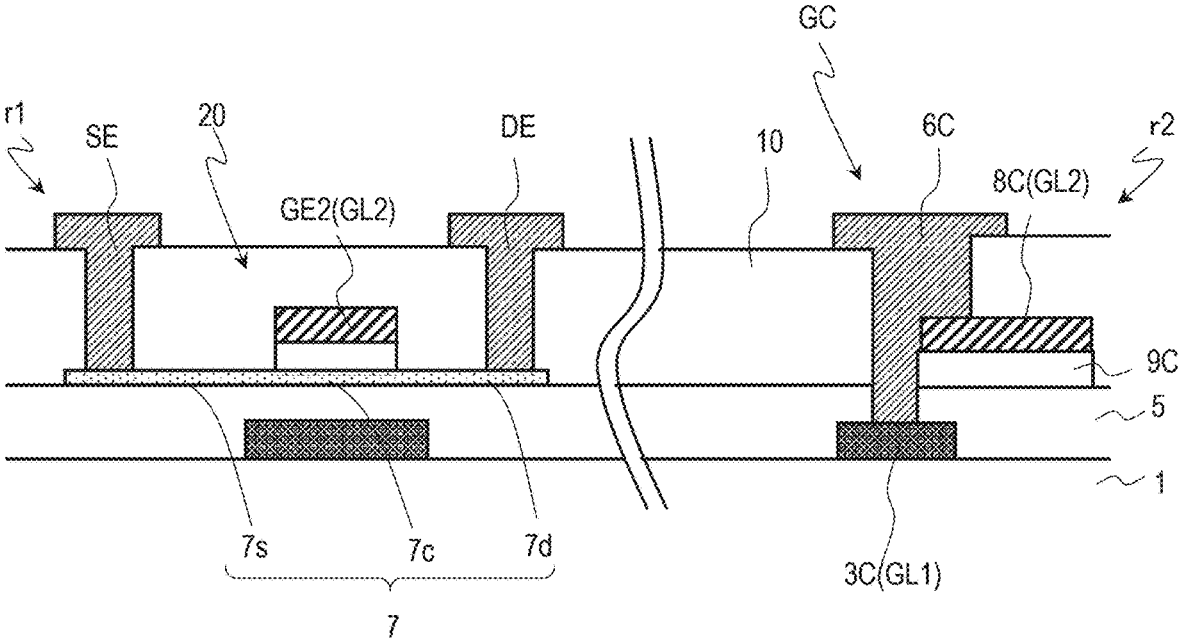

FIG. 10I is a process cross-sectional view illustrating the example of the method for manufacturing the active matrix substrate 101.

Figure 10J:
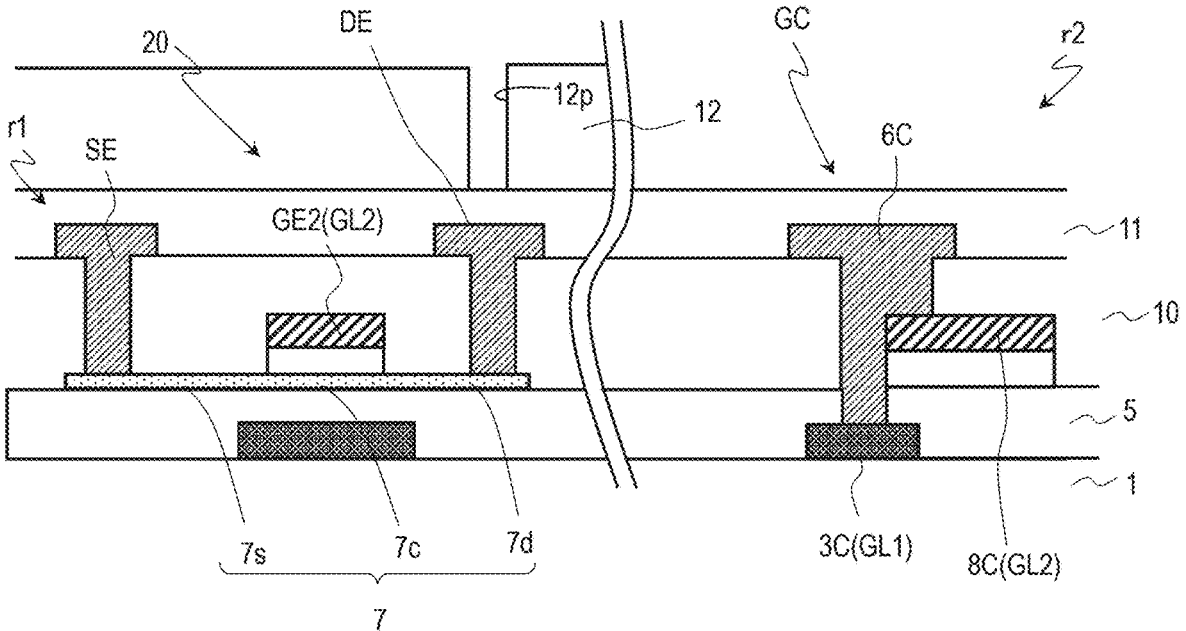

FIG. 10J is a process cross-sectional view illustrating the example of the method for manufacturing the active matrix substrate 101.

Figure 10K:
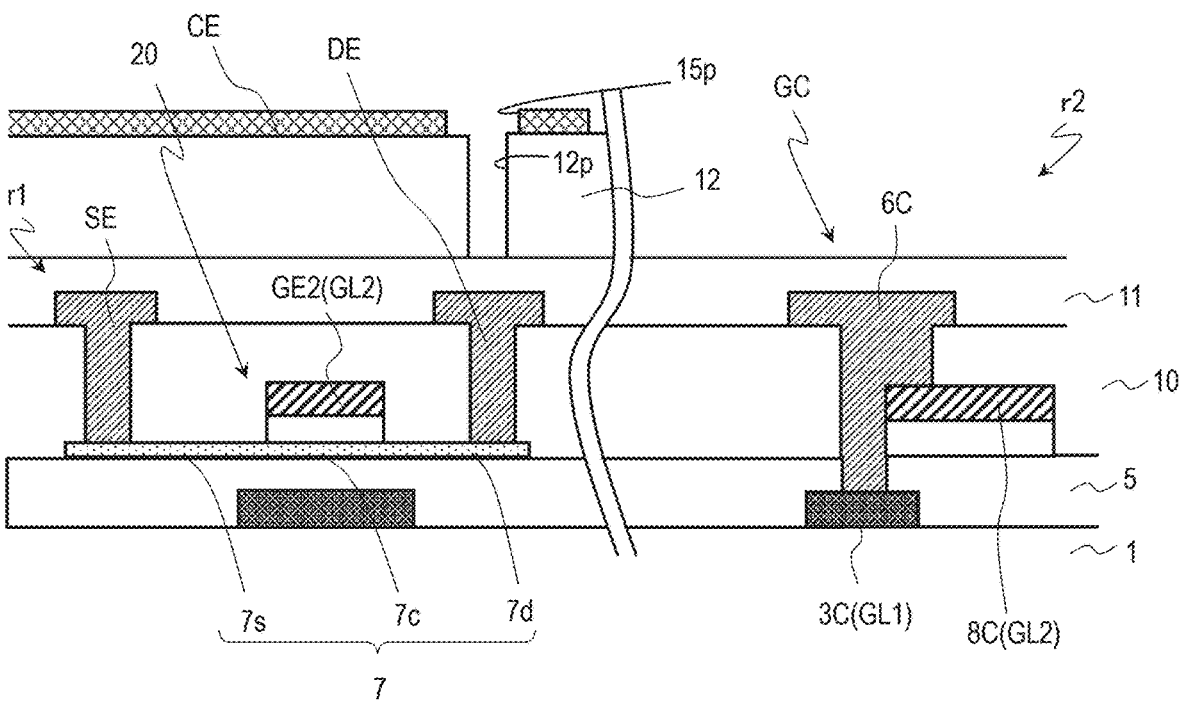

FIG. 10K is a process cross-sectional view illustrating the example of the method for manufacturing the active matrix substrate 101.

Figure 10L:
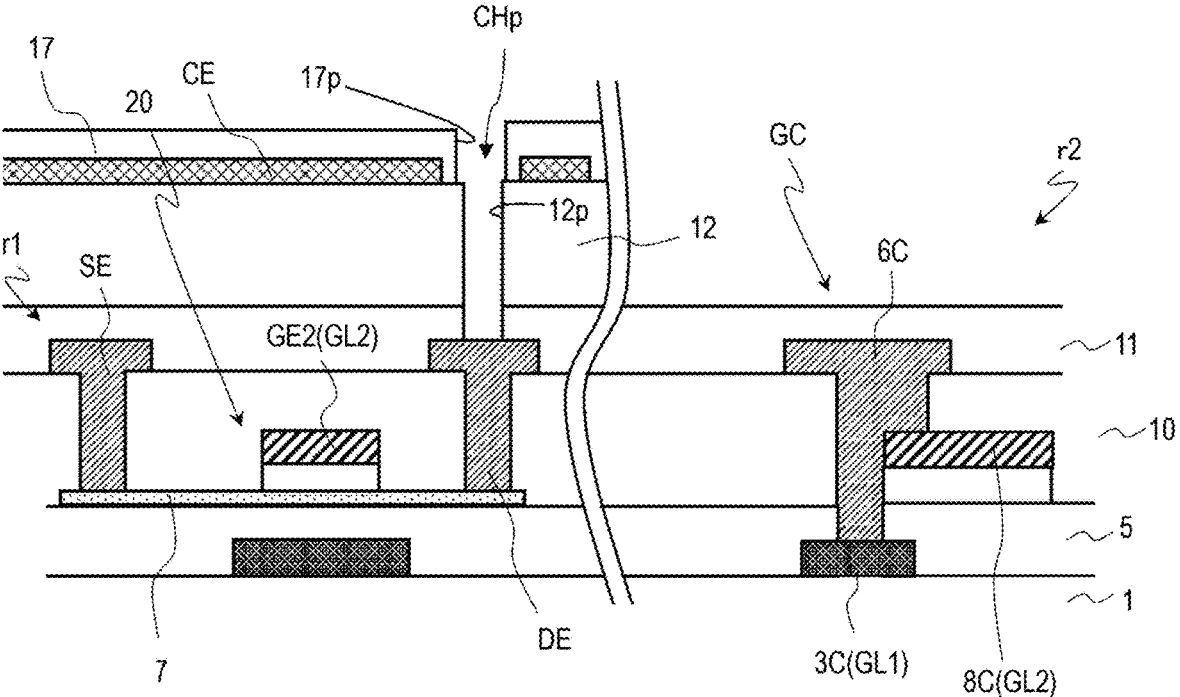

FIG. 10L is a process cross-sectional view illustrating the example of the method for manufacturing the active matrix substrate 101.

Figure 10M:
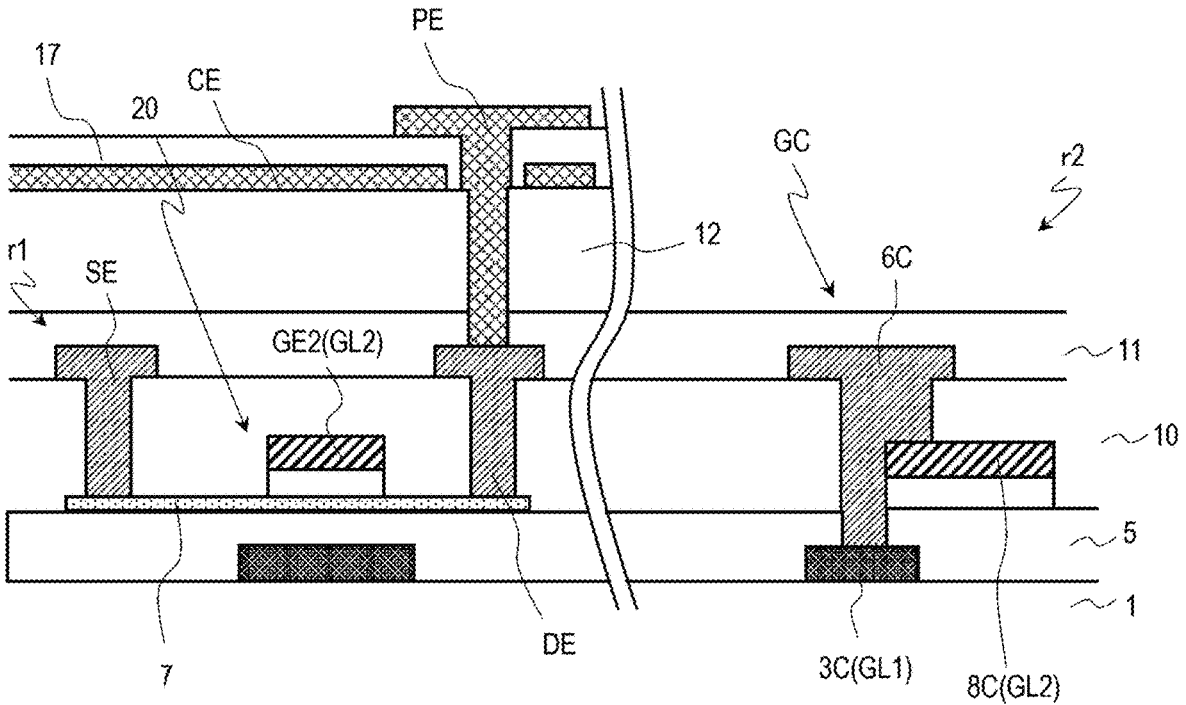

FIG. 10M is a process cross-sectional view illustrating the example of the method for manufacturing the active matrix substrate 101.

Figure 11A:
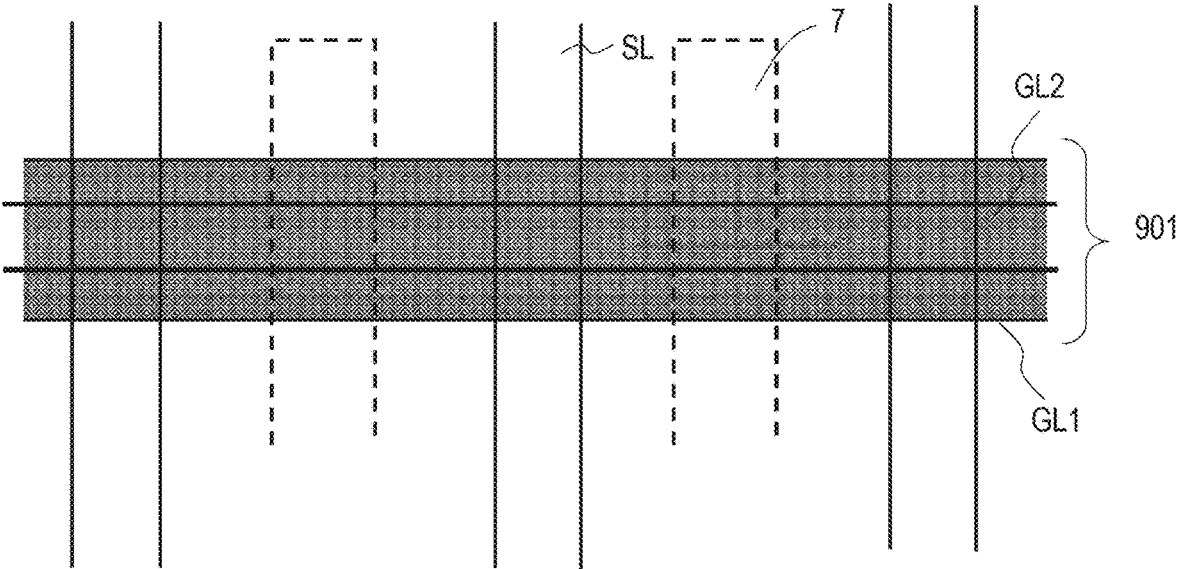

FIG. 11A is a plan view illustrating a structure of a gate portion 901 of a first reference example.

Figure 11B:
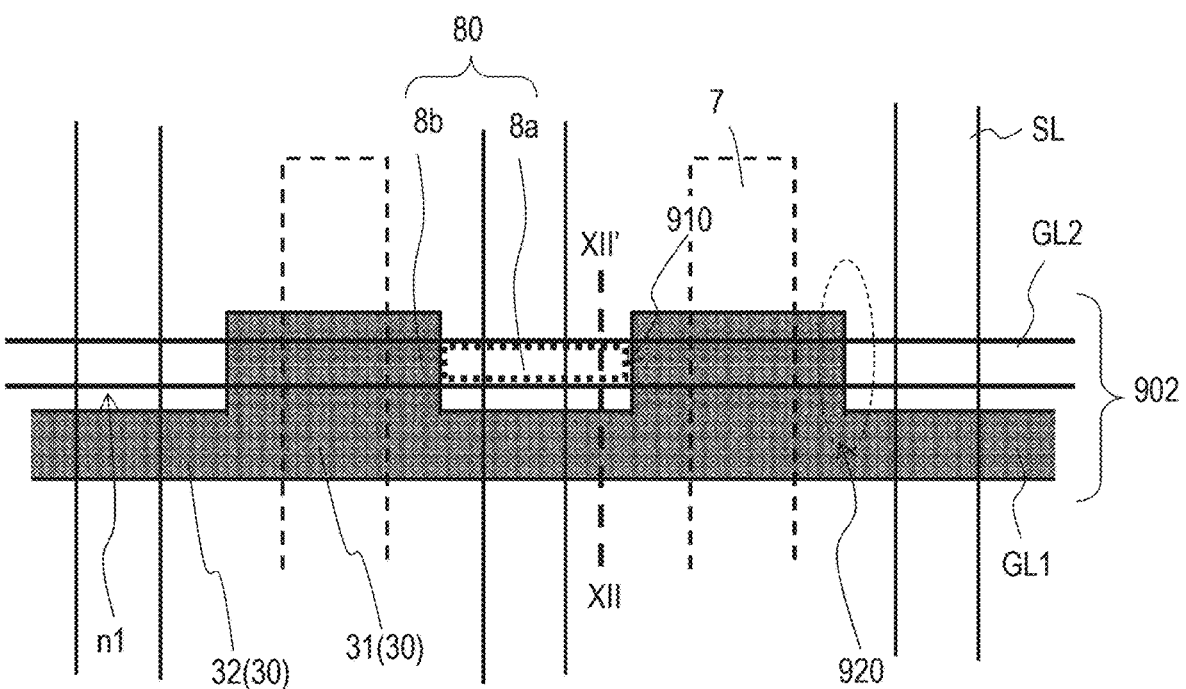

FIG. 11B is a plan view illustrating a structure of a gate portion 902 of a second reference example.

Figure 11C:
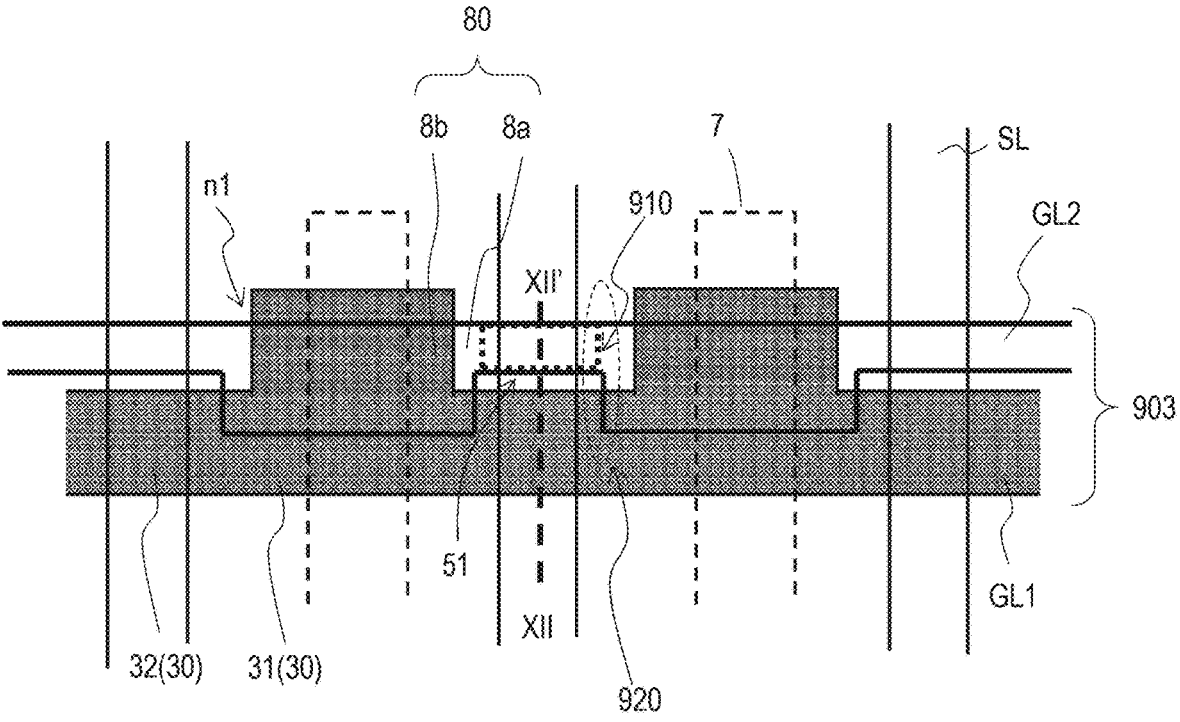

FIG. 11C is a plan view illustrating a structure of a gate portion 903 of a third reference example.

Figure 12:
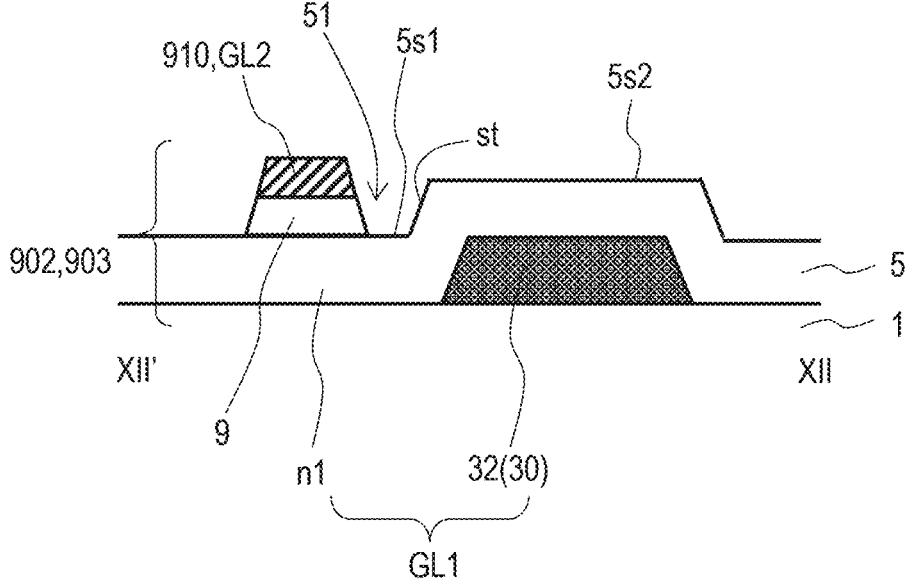

FIG. 12 is a cross-sectional view of the gate portions 902 and 903 taken along the line XII-XII' illustrated in FIG. 11B and FIG. 11C.

DESCRIPTION OF EMBODIMENTS

Hereinafter, an active matrix substrate according to an embodiment of the disclosure will be described with reference to the drawings.

Overall Structure of Active Matrix Substrate 101

Figure 1:
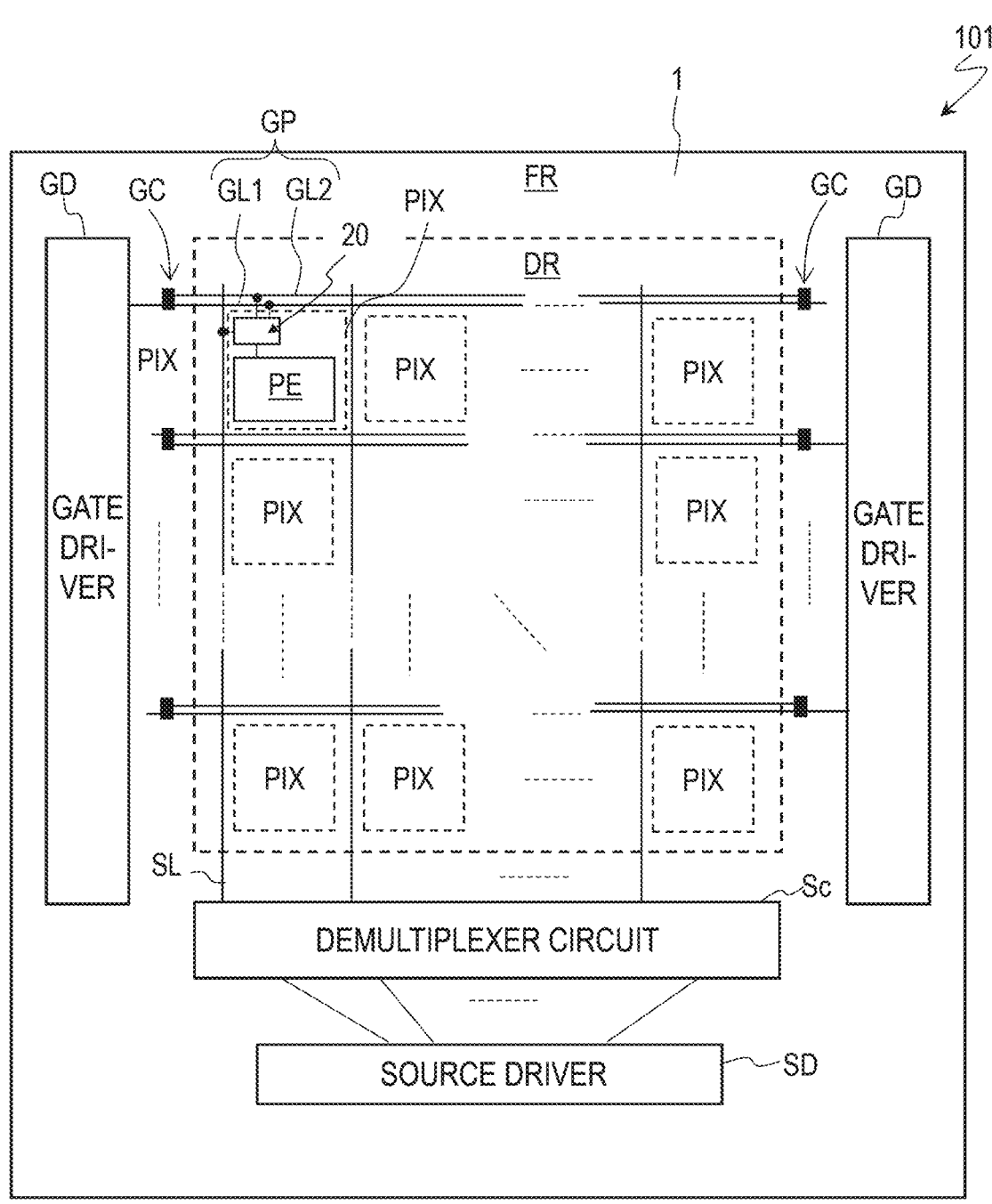
FIG. 1 is a schematic view illustrating an example of a planar structure of an active matrix substrate 101.

FIG. 1 is a plan view schematically illustrating an example of an active matrix substrate 101. The active matrix substrate 101 includes a display region DR contributing to display, and a peripheral region (frame region) FR positioned outside the display region DR. The display region DR includes a plurality of pixel areas PIX arrayed in a matrix shape in a row direction and a column direction. Each of the plurality of pixel areas PIX (also simply referred to as a "pixel") is an area corresponding to a pixel of the display device. The peripheral region FR is a region positioned around the display region DR and does not contribute to display.

The active matrix substrate 101 includes, in the display region DR, a plurality of source wiring lines SL each extending substantially in the column direction, and a plurality of lower gate wiring lines GL1 each extending substantially in the row direction, and a plurality of upper gate wiring lines GL2 each extending substantially in the row direction. Each one of the lower gate wiring lines GL1 partially overlaps with each one of the upper gate wiring lines GL2 via an insulator. In the present specification, a set of the lower gate wiring line GL1 and the upper gate wiring line GL2 partially overlapping with each other via the insulator is referred to as a "gate portion GP". Each of the plurality of pixel areas PIX is defined by the gate portions GP and the source wiring lines SL, for example.

The active matrix substrate 101 further includes, in the display region DR, a substrate 1, a plurality of pixel TFTs (hereinafter simply referred to as "TFTs") 20 supported on the substrate 1, and a plurality of pixel electrodes PE. Each of the TFTs 20 and each of the pixel electrodes PE are provided corresponding to one of the plurality of pixel areas PIX.

The TFT 20 is an oxide semiconductor TFT having an oxide semiconductor layer as an active layer. A part (referred to as a "first region") of the oxide semiconductor layer of the TFT 20 is electrically connected to one of the plurality of source wiring lines SL. Another part (referred to as a "second region") of the oxide semiconductor layer of the TFT 20 is electrically connected to the pixel electrode PE. Here, as will be described below, the TFT 20 has a double gate structure including a lower gate electrode and an upper gate electrode. The lower gate electrode and the upper gate electrode are electrically connected to the lower gate wiring line GL1 and the upper gate wiring line GL2 in the corresponding gate portion GP, respectively.

When the active matrix substrate 101 is applied to a display device of a transverse electrical field mode such as a Fringe Field Switching (FFS) mode, an electrode (common electrode) CE that is common to the plurality of pixels PIX is provided in the active matrix substrate 101.

In the peripheral region FR, peripheral circuits, such as gate drivers GD that drive the gate wiring lines GL and a demultiplexer circuit Sc that drives the source wiring lines SL in a time division manner, are formed in a monolithic manner. The demultiplexer circuit is connected to a source driver SD mounted by a chip on glass (COG) technique, for example. Further, wiring line connection sections, such as a plurality of gate terminal sections, a plurality of source terminal sections, and a plurality of source-gate wiring line connection sections, are disposed.

At least one of the gate wiring lines GL1 and GL2 in each of the gate portions GP is connected to a gate driver (not illustrated) via the corresponding gate terminal section. Each of the source wiring lines SL is connected to a source driver (not illustrated) via the corresponding source terminal section. The gate driver and the source driver may be monolithically formed or implemented in the peripheral region FR of the active matrix substrate 101.

The lower gate wiring line GL1 and the upper gate wiring line GL2 of each of the gate portions GP may extend in the row direction up to the peripheral region FR, and may be electrically connected to each other in the peripheral region FR. In the present specification, a wiring line connection section that electrically connects the lower gate wiring line GL1 and the upper gate wiring line GL2 of each of the gate portions GP is referred to as a "gate wiring line connection section GC". A pair of the gate wiring line connection sections GC positioned with the display region DR interposed therebetween may be provided with respect to one of the gate portions GP (in other words, one set of the lower gate wiring line GL1 and the upper gate wiring line GL2).

Note that, in the illustrated example, the same gate signals are supplied to the lower gate wiring line GL1 and the upper gate wiring line GL2 of each of the gate portions GP, but the gate signal may be supplied only to the upper gate wiring line, and the lower gate wiring line may be connected to a fixed potential. Alternatively, mutually different signals may be supplied to the upper gate wiring line and the lower gate wiring line.

Structure of Pixel Area in Active Matrix Substrate 101

Hereinafter, a structure of the pixel area of the active matrix substrate of the present embodiment will be described by using an active matrix substrate applied to a display device of an FFS mode as an example, with reference to the accompanying drawings. The FFS mode is a mode of a lateral electric field scheme in which a pair of electrodes is provided in one of substrates, and an electrical field is applied to liquid crystal molecules in a direction (lateral direction) parallel to a substrate plane.

In the following description, a layer that includes electrodes, wiring lines, and the like formed from a first conductive film (also referred to as a lower conductive film) and that is disposed closer to the substrate side than to the oxide semiconductor layer serving as the active layer of the pixel TFT is referred to as a "first metal layer M1". The first metal layer M1 includes the lower gate wiring lines, for example. In this example, the first metal layer M1 is disposed on the substrate side of the oxide semiconductor layer with a lower gate insulating layer interposed therebetween. Further, a layer that is disposed on the oxide semiconductor layer with an upper gate insulating layer interposed therebetween and that includes electrodes, wiring lines, and the like formed from a second conductive film is referred to as a "second metal layer M2". The second metal layer M2 includes the upper gate wiring lines. In this example, a layer is provided that is disposed on the second metal layer M2 with an interlayer insulating layer interposed therebetween, and that includes electrodes, wiring lines, and the like formed from a third conductive film. This layer is referred to as a "third metal layer M3". The third metal layer M3 includes the plurality of source wiring lines (source wiring lines SL), for example.

Figure 2A:
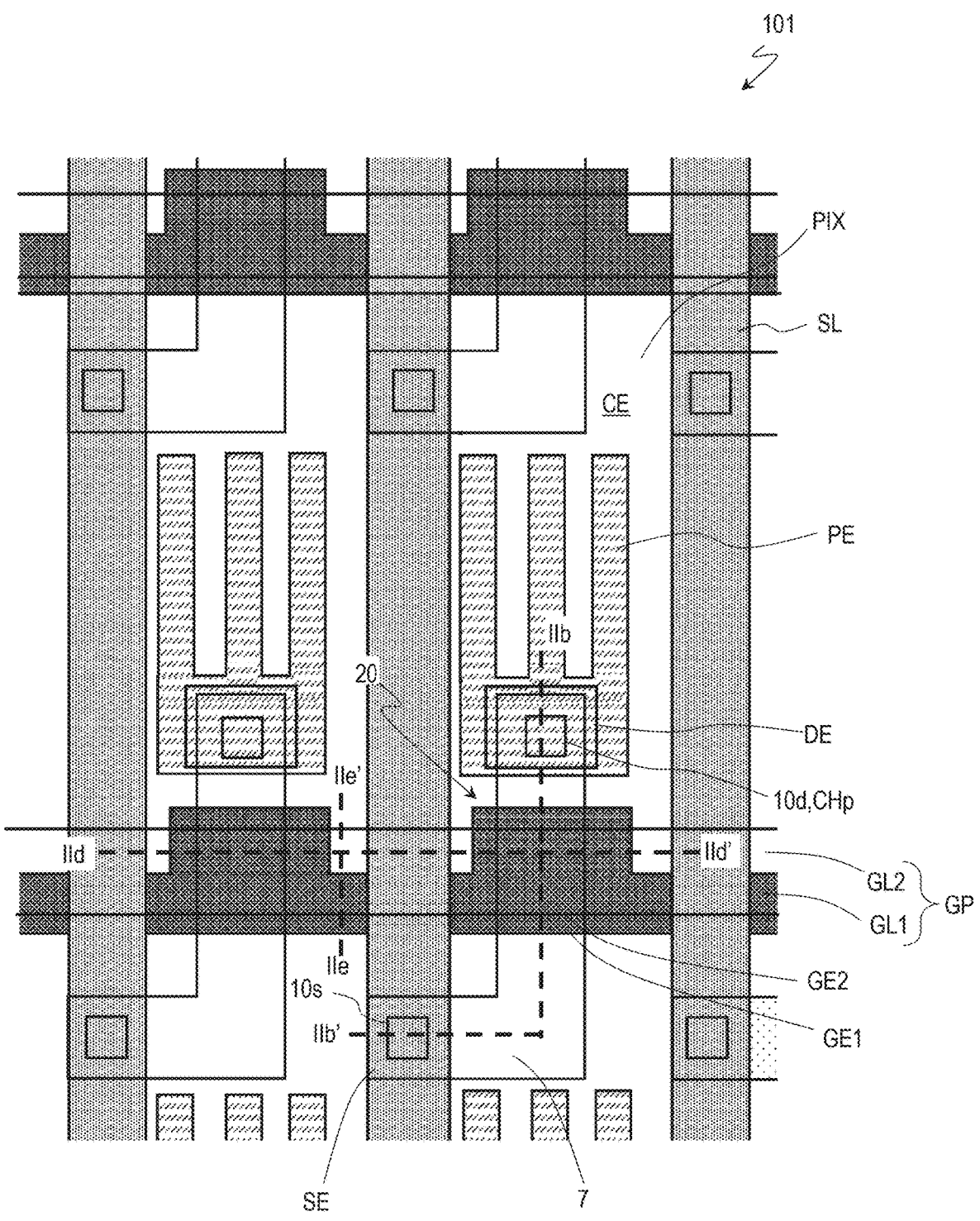
FIG. 2A is a plan view illustrating an example of a pixel area in the active matrix substrate 101 according to a first embodiment.
Figure 2B:
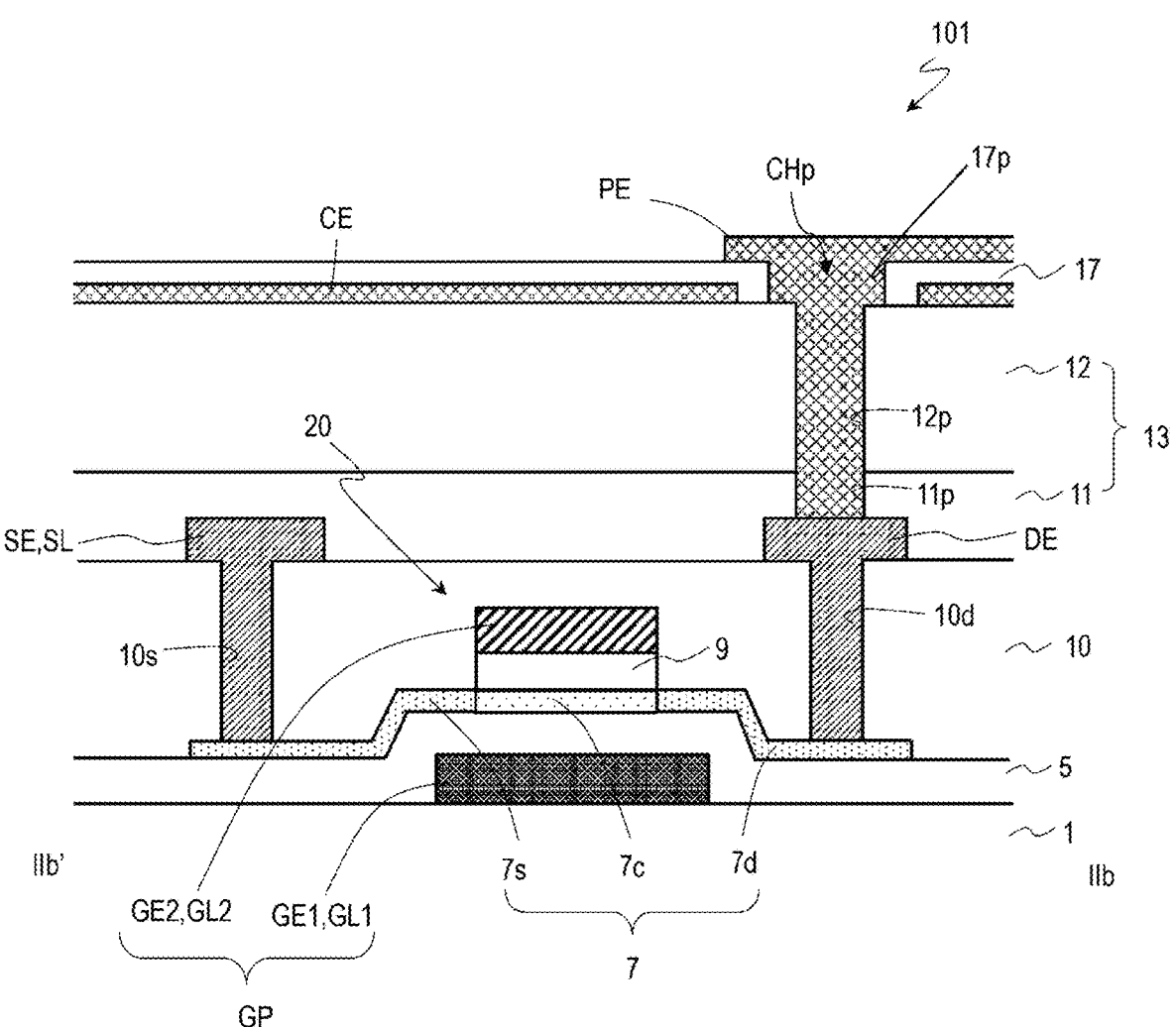
FIG. 2B is a cross-sectional view of the pixel area taken along the line IIb-IIb' illustrated in FIG. 2A.

FIG. 2A is a plan view illustrating an example of the pixel area PIX in the active matrix substrate 101. Although the active matrix substrate 101 includes a number of the pixel areas PIX, only two of the pixel areas PIX are illustrated in FIG. 2A. FIG. 2B is a cross-sectional view taken along the line IIb-IIb' illustrated in FIG. 2A, and illustrates a cross section of the TFT 20 in a channel length direction.

The active matrix substrate 101 includes the substrate 1 having a main surface, the plurality of TFTs 20 supported on the main surface of the substrate 1, the plurality of lower gate wiring lines GL1 extending in the row direction, the plurality of upper gate wiring lines GL2 extending in the row direction, the plurality of source wiring lines SL extending in the column direction, a lower gate insulating layer 5, and an upper gate insulating layer 9.

Note that, in the present specification, "extending in the row direction" means extending substantially in the row direction as a whole, and may include a portion extending in a direction intersecting the row direction, a bent portion, or a curved portion. Further, as will be described below, when viewed from the normal direction of the substrate 1, one edge (edge portion), extending in the row direction, of each of the gate wiring lines, may include a portion (recessed portion) that is bent in a convex shape toward the other edge portion of the gate wiring line. Similarly, "extending in the column direction" means extending substantially in the row direction as a whole, and may include a portion extending in a direction intersecting the column direction.

The plurality of lower gate wiring lines GL1 are positioned between the substrate 1 and the plurality of upper gate wiring lines GL2. Each of the upper gate wiring lines GL2 is disposed corresponding to one of the lower gate wiring lines GL1. In FIG. 2A, two sets of the gate portions GP are illustrated, each of which includes the lower gate wiring line GL1 and the upper gate wiring line GL2 corresponding to each other. In each of the gate portions GP, the upper gate wiring line GL2 is disposed on the lower gate wiring line GL1 via the lower gate insulating layer 5 and the upper gate insulating layer 9. In this example, the plurality of lower gate wiring lines GL1 are formed in the first metal layer M1, and the plurality of upper gate wiring lines GL2 are formed in the second metal layer M2.

The lower gate insulating layer 5 is disposed between the plurality of lower gate wiring lines GL1 and the plurality of upper gate wiring lines GL2. The lower gate insulating layer 5 may cover the plurality of lower gate wiring lines GL1.

The upper gate insulating layer 9 is disposed between the lower gate insulating layer 5 and the upper gate wiring lines GL2. The upper gate insulating layer 9 may be disposed only between the lower gate insulating layer 5 and each of the upper gate wiring lines GL2. In the illustrated example, when viewed from the normal direction of the substrate 1, the upper gate insulating layer 9 is formed only in regions including the lower gate wiring line GL1 and overlapping the second metal layer M2. Such a configuration is obtained by patterning the upper gate insulating layer 9 using the same etching mask as that for patterning the second metal layer M2 (second conductive film), or using the second metal layer as a mask. The edges of the upper gate insulating layer 9 may be aligned with the edges of the electrodes and the wiring lines in the second metal layer M2.

The source wiring lines SL are disposed on an interlayer insulating layer 10 covering the upper gate wiring lines GL2. In this example, the source wiring lines SL are formed in the third metal layer M3.

The active matrix substrate 101 may also include the plurality of TFTs 20 and the plurality of pixel electrodes PE. Each of the plurality of TFTs 20 and each of the plurality of pixel electrodes PE are provided corresponding to each of the plurality of pixel areas PIX. The active matrix substrate 101 may further include a common electrode CE. The pixel electrode PE and the common electrode CE may be provided in an upper layer overlying the third metal layer M3.

Each of the plurality of TFTs 20 includes an oxide semiconductor layer 7 including a channel region 7c, a lower gate electrode GE1, an upper gate electrode GE2, a source electrode SE, and a drain electrode DE.

The oxide semiconductor layer 7 of each of the TFTs 20 includes the channel region 7c, and a first region 7s and a second region 7d disposed at both sides of the channel region 7c. The first region 7s and the second region 7d are low-resistance regions each having a specific resistance lower than that of the channel region 7c. The first region 7s is electrically connected to the source electrode SE, and the second region 7d is electrically connected to the drain electrode DE.

The lower gate electrode GE1 is positioned on the substrate 1 side of the oxide semiconductor layer 7, and overlaps at least a part of the oxide semiconductor layer 7 with the lower gate insulating layer 5 interposed therebetween. The upper gate electrode GE2 is positioned on the opposite side to the substrate 1 of the oxide semiconductor layer 7, and overlaps at least a part of the oxide semiconductor layer 7 with the upper gate insulating layer 9 interposed therebetween. In this example, when viewed from the normal direction of the substrate 1, the upper gate electrode GE2 overlaps the channel region 7c of the oxide semiconductor layer 7, and the lower gate electrode GE1 at least partially overlaps the channel region 7c.

The upper gate electrode GE2 may cover the channel region 7c, and need not necessarily cover the first region 7s and the second region 7d. Such a structure is obtained by performing resistance lowering processing on the oxide semiconductor layer 7 using the upper gate electrode GE2 as a mask.

The lower gate electrode GE1 functions as a gate electrode, and can also function as a light blocking layer that blocks light (backlight) traveling from the substrate 1 side toward the channel region 7c. When viewed from the normal direction of the substrate 1, the lower gate electrode GE1 may overlap the entire channel region 7c.

When viewed from the normal direction of the substrate 1, the oxide semiconductor layer 7 of each of the TFTs 20 extends from the corresponding one of the pixel areas PIX to another of the pixel areas adjacent, in the column direction, to the corresponding one of the pixel areas PIX, while extending across the lower gate wiring line GL1 and the upper gate wiring line GL2 in the corresponding gate portion GP. When viewed from the normal direction of the substrate 1, portions, of the lower gate wiring line GL1 and the upper gate wiring line GL2, intersecting the oxide semiconductor layer 7 can function as the lower gate electrode GE1 and the upper gate electrode GE2 of the corresponding TFT 20, respectively. In the present embodiment, the lower gate wiring line GL1 and the upper gate wiring line GL2 in one of the gate portions GP are electrically connected to each other, and the same gate signals are supplied to these wiring lines. The shape and arrangement of each of the gate wiring lines GL1 and GL2 in the gate portion GP are described above.

The interlayer insulating layer 10 is formed to cover the oxide semiconductor layer 7, the upper gate insulating layer 9, and the second metal layer M2. The interlayer insulating layer 10 may be in contact with the first region 7s and the second region 7d of the oxide semiconductor layer 7.

The source electrode SE and the drain electrode DE are disposed on the interlayer insulating layer 10. In this example, the source electrode SE and the drain electrode DE are formed by using the same conductive film as that of the source wiring line SL (in other words, in the third metal layer M3). The source electrode SE is electrically connected to the corresponding source wiring line SL. The drain electrode DE is electrically connected to the corresponding pixel electrode PE. The source electrode SE may be integrally formed with the corresponding source wiring line SL. For example, the source electrode SE may be connected to the corresponding source wiring line SL, or may be a part of the corresponding source wiring line SL as illustrated in the drawing. In such a case, a portion of the source wiring line SL connected to the first region 7s of the oxide semiconductor layer 7 is referred to as the "source electrode SE".

A first opening 10s that exposes a part of the first region 7s of the oxide semiconductor layer 7 and a second opening 10d that exposes a part of the second region 7d are provided in the interlayer insulating layer 10. The source electrode SE is disposed on the interlayer insulating layer 10 and in the first opening 10s, and is connected to the first region 7s in the first opening 10s. The drain electrode DE is disposed on the interlayer insulating layer 10 and in the second opening 10d, and is connected to the second region 7d in the second opening 10d.

An upper insulating layer 13 is disposed on the third metal layer M3. The upper insulating layer 13 includes an inorganic insulating layer (passivation film) 11, for example. As illustrated in the drawing, the upper insulating layer 13 may have a layered structure including the inorganic insulating layer 11 and an organic insulating layer 12 formed on the inorganic insulating layer 11. The organic insulating layer 12 need not necessarily be formed. Alternatively, the organic insulating layer 12 may be formed only in the display region.

The pixel electrode PE and the common electrode CE are formed on the upper insulating layer 13. The pixel electrode PE and the common electrode CE may be disposed so as to face each other with a dielectric layer 17 interposed therebetween. In the present example, the common electrode CE is disposed on the upper insulating layer 13, and the pixel electrode PE is disposed on the common electrode CE with the dielectric layer 17 interposed therebetween. Note that the pixel electrode PE may be disposed on the upper insulating layer 13, and the common electrode CE may be disposed on the pixel electrode PE with the dielectric layer 17 interposed therebetween. In the present specification, an electrode positioned at the substrate 1 side of the common electrode CE and the pixel electrode PE is referred to as a "lower transparent electrode", and an electrode disposed on the lower transparent electrode with the dielectric layer 17 interposed therebetween is referred to as an "upper transparent electrode". In the upper transparent electrode (in the pixel electrode PE in this example), one or a plurality of slits (openings) or notched portions are provided in each of the pixel areas.

The plurality of pixel electrodes PE are separated for each of the pixel areas. The pixel electrode PE is electrically connected to the drain electrode DE of the corresponding TFT 20 in a pixel contact hole CHp. In the present embodiment, the pixel electrode PE is disposed on the dielectric layer 17, and thus, the pixel contact hole CHp is formed in the upper insulating layer 13 and the dielectric layer 17. The pixel contact hole CHp is configured of an opening 11$p$ of the inorganic insulating layer 11, an opening 12$p$ of the organic insulating layer 12, and an opening 17$p$ of the dielectric layer 17.

The common electrode CE need not necessarily be separated for each of the pixel areas PIX. For example, the common electrode CE may include an opening in a region in which each of the pixel contact holes CHp is formed, and may be formed over the entire pixel area except for this region.

In the present embodiment, the lower gate electrode GE1 and the upper gate electrode GE2 in each of the TFTs 20 are electrically connected to each other, but mutually different gate signals may be supplied thereto. Alternatively, only the upper gate electrode GE2 may function as a gate electrode, and the lower gate electrode GE1 may be in an electrically floating state or may be fixed to a fixed potential (a common potential, for example). Even in this case, the lower gate electrode GE1 can function as the light blocking layer that is configured to block the light (backlight) traveling from the substrate 1 side toward the channel region 7$c$.

The TFT 20 may not include the drain electrode DE in the third metal layer M3. For example, a pixel contact hole exposing the second region 7$d$ of the oxide semiconductor layer 7 may be formed in the insulating layer including the upper insulating layer 13, and the pixel electrode PE may directly contact the second region 7$d$ of the oxide semiconductor layer 7 in the pixel contact hole.

The active matrix substrate 101 may be an active matrix substrate used in an in-cell touch panel, for example. In that case, in the active matrix substrate 101, a metal layer for forming wiring lines (touch wiring lines) for the touch panel may be separately provided. The wiring lines for the touch panel may be disposed in an upper layer overlying the upper insulating layer 13. The metal layer including the touch wiring lines may be disposed between the upper insulating layer 13 and the common electrode CE, for example. The common electrode CE may be separated into a plurality of touch electrodes, and each of the touch wiring lines may be electrically connected to the corresponding touch electrode.

Although not illustrated in the drawings, a circuit TFT having a structure similar to that of the TFT 20 serving as the pixel TFT may be provided in the non-display region.

Structure of Gate Wiring Line

Here, a structure of the gate wiring line in the present embodiment is described using the lower gate wiring line GL1 and the upper gate wiring line GL2 included in one of the gate portions GP, as an example.

Figure 2C:
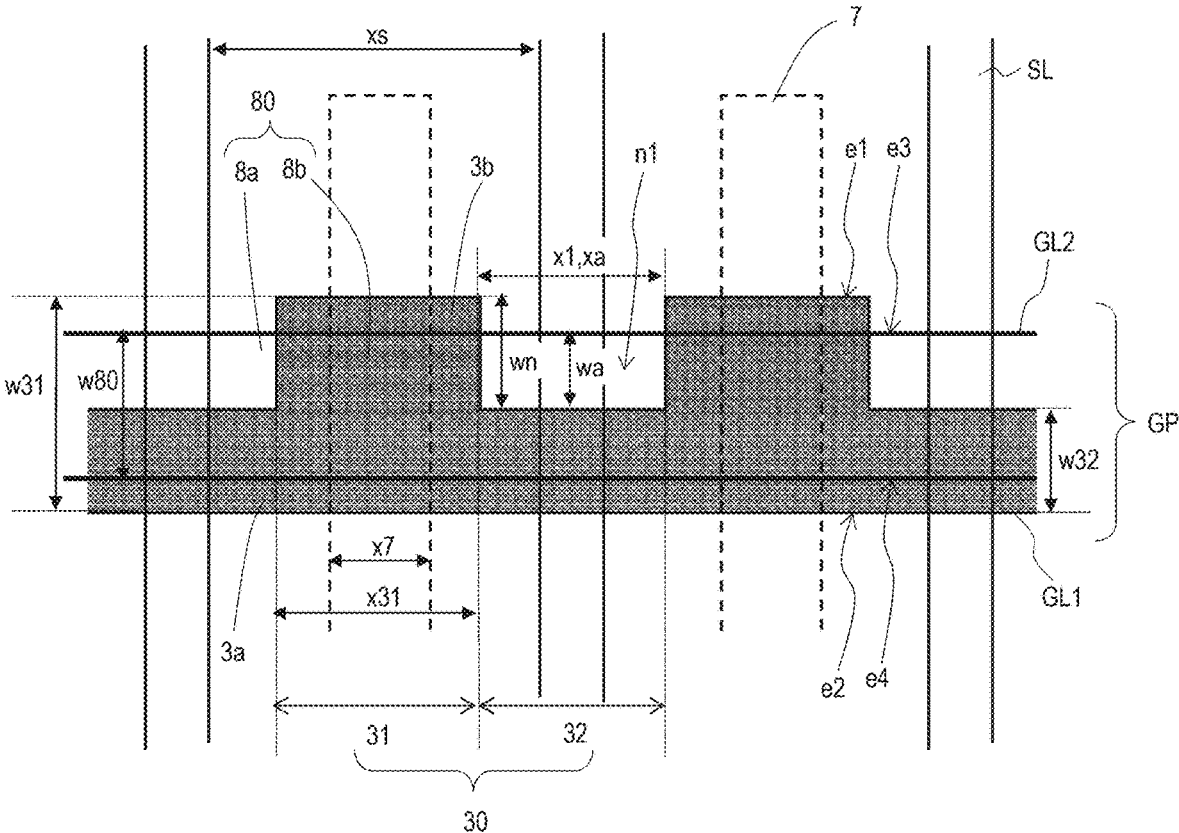
FIG. 2C is an enlarged plan view of a gate portion GP.
Figure 2D:
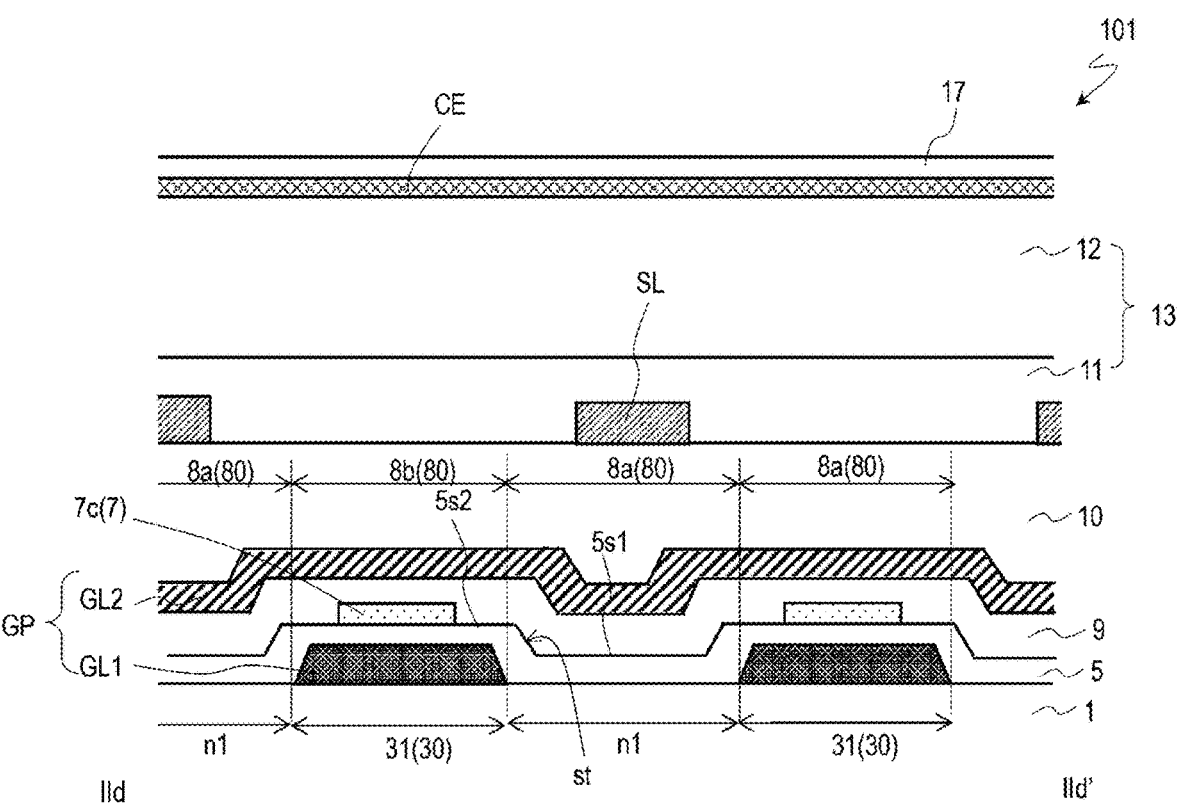
FIG. 2D is a cross-sectional view of the pixel area taken along the line IId-IId' illustrated in FIG. 2A.
Figure 2E:
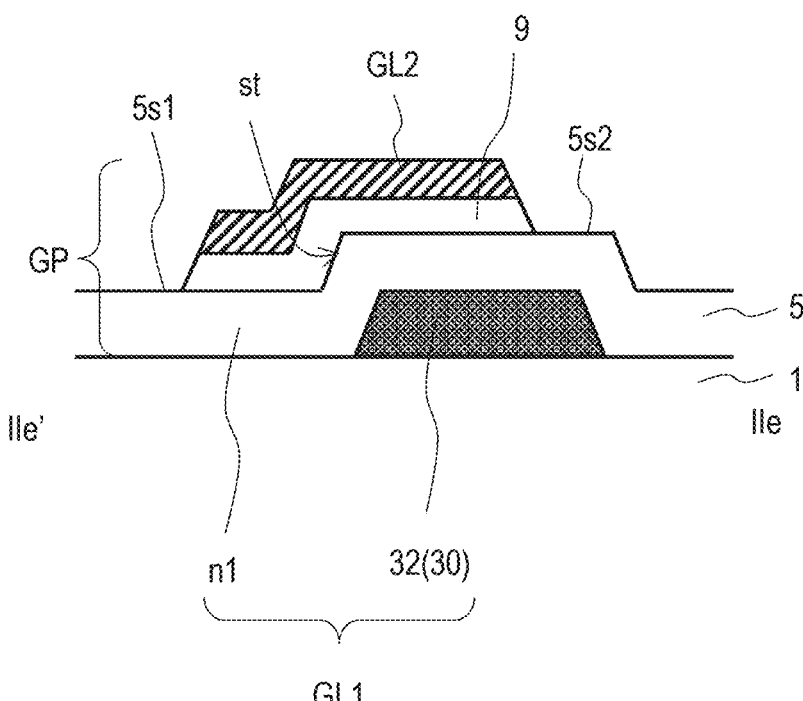
FIG. 2E is a cross-sectional view of the gate portion GP taken along the line IIe-IIe' illustrated in FIG. 2A.

FIG. 2C is an enlarged plan view illustrating one of the gate portions GP in the active matrix substrate 101. FIG. 2D and FIG. 2E are cross-sectional views of the gate portion GP illustrating cross-sectional structures taken along the line IId-IId' and the line IIe-IIe' respectively illustrated in FIG. 2A. Note that, in FIG. 2E, the structure of upper layers overlying the gate portion GP is omitted.

When viewed from the normal direction of the substrate 1, the lower gate wiring line GL1 includes a plurality of first notched portions n1 disposed separated from each other, and a first solid portion 30 other than the plurality of first notched portions n1. In the present specification, the "solid portion" of the gate wiring line (lower gate wiring line or upper gate wiring line) refers to a portion in which a conductive material is present. The "notched portion" of the gate wiring line is a portion from which the conductive material is removed, and, when viewed from the normal direction of the substrate 1, for example, includes a portion positioned inside a recessed portion formed in one of a pair of edge portions, of the gate wiring line, that extend in the row direction while facing each other, and also includes an opening surrounded by the solid portion of the gate wiring line, and the like. The "recessed portion" formed in one of the edge portions is a recessed portion formed as a result of the one of the edge portions being recessed toward the other edge portion side (being bent into a convex shape with respect to the other edge portion). When viewed from the normal direction of the substrate 1, an underlayer of the gate wiring line is exposed from the gate wiring line in the notched portion.

The first solid portion 30 of the lower gate wiring line GL1 includes a plurality of first portions 31 disposed spaced apart in the row direction, and a plurality of second portions 32 positioned between two of the first portions 31 adjacent to each other. Each of the second portions 32 is a portion adjacent to one of the first notched portions n1 in the column direction (a portion overlapping one of the first notched portions n1 in the column direction). In the present specification, "overlapping the first notched portion in the column direction" means that a position in the row direction is the same as that of the first notched portion. A width (width in the column direction) w31 of the first portion 31 may be greater than a width w32 of the second portion 32.

When viewed from the normal direction of the substrate 1, the first solid portion 30 of the lower gate wiring line GL1 includes edge portions e1 and e2 extending in the row direction while facing each other. In the illustrated example, the plurality of first notched portions n1 are disposed only on one of the edge portions (here, the edge portion e1) side. In other words, when viewed from the normal direction of the substrate 1, the recessed portion defining the first notched portion n1 in the edge portion e1 is formed as a result of one of the edge portions, that is, the edge portion e1 being bent into a convex shape toward the other edge portion e2 side. In other words, it can be said that a plurality of protruding portions defining the first portions 31 are formed in the edge portion e1.

In this example, each of the first notched portions n1 has a rectangular planar shape, but may have another shape such as a triangular shape, a trapezoidal shape, or a semi-circular shape. Further, some of the plurality of first notched portions n1 may be formed on the other edge portion e2 side. In that case, the first notched portions n1 positioned on the edge portion e1 side and the first notched portions n1 positioned on the edge portion e2 side may be disposed so as not to overlap with each other in the column direction, or may be disposed so as to at least partially overlap with each other in the column direction.

At least one of the first notched portions n1 preferably includes a portion positioned between two of the source wiring lines SL adjacent to each other. In this way, parasitic capacitance formed in each of the gate portions GP can be effectively reduced. Further, at least one of the first portions 31 preferably includes a portion positioned between two of the source wiring lines SL adjacent to each other. In this way, when viewed from the normal direction of the substrate 1, the first portion 31 of the lower gate wiring line GL1 can be caused to intersect the oxide semiconductor layer 7. In the illustrated example, parts of two of the first notched portions n1 adjacent to each other and one of the first portions 31 positioned therebetween are disposed between the two adjacent source wiring lines SL.

The upper gate wiring line GL2 is disposed on the lower gate wiring line GL1 via the lower gate insulating layer 5 and the upper gate insulating layer 9.

When viewed from the normal direction of the substrate 1, the upper gate wiring line GL2 includes a second solid portion 80 that includes a plurality of first overlapping portions 8a, each of which at least partially overlaps one of the first notched portions n1 of the lower gate wiring line GL1, and a second overlapping portion 8b that overlaps the first solid portion 30 of the lower gate wiring line GL1. In this example, since the upper gate wiring line GL2 does not include any notched portions, the entire upper gate wiring line GL2 is the second solid portion 80.

The first overlapping portions 8a are disposed spaced apart from each other. In this example, each of the first overlapping portions 8a is positioned inside the recessed portion formed at the edge portion e1 of the lower gate wiring line GL1.

When viewed from the normal direction of the substrate 1, the second overlapping portion 8b extends continuously from, of the plurality of source wiring lines SL, one of the two adjacent source wiring lines SL to the other thereof. The second overlapping portion 8b may extend continuously between the source wiring lines SL at both ends of the display region.

The second solid portion 80 of the upper gate wiring line GL2 includes edge portions e3 and e4 extending in the row direction while facing each other. In the illustrated example, one of the edge portions of the upper gate wiring line GL2 (here, the edge portion e3) extends across the plurality of first notched portions n1 of the lower gate wiring line GL1 in the row direction. The other edge portion e4 is positioned between the two adjacent source wiring lines SL, and between the two edge portions e1 and e2 of the lower gate wiring line GL1 (in other words, inside the first solid portion 30 of the lower gate wiring line GL1).

When viewed from the normal direction of the substrate 1, the second solid portion 80 of the upper gate wiring line GL2 may include a portion positioned inside the first portion 31 of the lower gate wiring line GL1 over the entire width thereof, and a portion extending in the row direction straddling the first notched portions n1 and the first solid portion 30.

In the example illustrated in FIG. 2A, between the two adjacent source wiring lines SL, a width (width in the column direction) w80 of the second solid portion 80 of the upper gate wiring line GL2 is substantially constant. The maximum width of the first solid portion 30 of the lower gate wiring line GL1 (here, the width w31 of the first portion 31) is greater than the width w80 of the upper gate wiring line GL2.

The first solid portion 30 of the lower gate wiring line GL1 includes non-overlapping portions that do not overlap the upper gate wiring line GL2. When viewed from the normal direction of the substrate 1, the non-overlapping portions of the lower gate wiring line GL1 may include a non-overlapping portion 3a that extends continuously from one of the two adjacent source wiring lines SL to the other thereof, and a plurality of non-overlapping portions 3b that are disposed spaced apart from each other. In this example, when viewed from the normal direction of the substrate 1, the edge portion e2 of the lower gate wiring line GL1 extends in the row direction on the outer side of the upper gate wiring line GL2, and a portion positioned between the edge portion e2 and the upper gate wiring line GL2 is the non-overlapping portion 3a. Further, when viewed from the normal direction of the substrate 1, of each of the first portions 31 of the lower gate wiring line GL1, a portion positioned between the edge portion e1 and the upper gate wiring line GL2 is the non-overlapping portion 3b.

When viewed from the normal direction of the substrate 1, the oxide semiconductor layer 7 of the oxide semiconductor TFT corresponding to the illustrated gate portion GP extends in the column direction across the gate portion GP. Here, when viewed from the normal direction of the substrate 1, the oxide semiconductor layer 7 extends across a portion in which the first solid portion 30 of the lower gate wiring line GL1 and the second solid portion 80 of the upper gate wiring line GL2 overlap with each other (in other words, the second overlapping portion 8b of the upper gate wiring line GL2).

When viewed from the normal direction of the substrate 1, the oxide semiconductor layer 7 preferably extends between two of the first notched portions n1 adjacent to each other of the lower gate wiring line GL1. In this way, since the first portions 31 having a wider width are disposed on the substrate 1 side of the channel region 7c of the oxide semiconductor layer 7, the channel region 7c can be more reliably shielded from light.

Effect Obtained by Structure of Gate Wiring Line

According to the present embodiment, the parasitic capacitance generated by the lower gate wiring line GL1 and the upper gate wiring line Gl2 can be reduced, while suppressing breakage of the upper gate wiring line GL2 due to a step in the lower gate wiring line GL1. Reasons for this will be described below.

FIG. 11A to FIG. 11C are plan views illustrating structures of gate portions 901 to 903 according to first to third reference examples, respectively. For ease of understanding, the same reference numerals are assigned to the same constituent elements as those illustrated in FIG. 2A.

In the lower gate insulating layer 5 covering the lower gate wiring line GL1, a step reflecting the lower gate wiring line GL1 may be formed (see FIG. 2B). Thus, the upper gate wiring line GL2 disposed on the lower gate insulating layer 5 can be broken or peeled off due to the influence of the step. In order to suppress this, for example, as illustrated in FIG. 11A, a configuration is conceivable in which, when viewed from the normal direction of the substrate 1, the entire upper gate wiring line GL2 is disposed inside the lower gate wiring line GL1. Such a configuration is disclosed in JP 2018-36315 A described above, for example. However, in the gate portion 901 illustrated in FIG. 11A, an area in which the lower gate wiring line GL1 and the upper gate wiring line GL2 overlap with each other via the insulator (dielectric) is increased, and there is a possibility that the parasitic capacitance may increase.

In contrast to this, according to the present embodiment, by providing the plurality of first notched portions n1 in the lower gate wiring line GL1, the parasitic capacitance formed between the lower gate wiring line GL1 and the upper gate wiring line GL2 can be reduced while securing the width (width in the column direction) of a portion, of the TFT 20, that functions as the lower gate electrode. In the present embodiment, when viewed from the normal direction of the substrate 1, in each of the gate portions GP, the lower gate wiring line GL1 includes the plurality of first notched portions n1 and the first solid portion 30, and the upper gate wiring line GL2 includes the second overlapping portion 8b overlapping the first solid portion 30 and the first overlapping portion 8a overlapping each of the plurality of first notched portions n1. The parasitic capacitance (overlap capacitance) is formed by the second overlapping portion 8b of the upper gate wiring line GL2, the first solid portion 30 of the lower gate wiring line GL1, and the dielectric (lower gate insulating layer 5 and the upper gate insulating layer 9) positioned therebetween. Thus, the area (overlap area) of the parasitic capacitance can be reduced by the area of the first overlapping portions 8a, and thus the parasitic capacitance can be reduced.

Here, as illustrated in FIG. 11B and FIG. 11C, structures are also conceivable in which, when viewed from the normal direction of the substrate 1, a portion 910 of the upper gate wiring line GL2 overlaps the entire width of the first notched portion n1. In these structures, the upper gate wiring line GL2 includes a cross portion 920 that completely intersects the first solid portion 30 of the lower gate wiring line GL1. Since the breakage of the upper gate wiring line GL2 is likely to occur in each of the cross portions 920, it is sometimes difficult to reliably suppress the breakage of the upper gate wiring line GL2.

With reference to FIG. 12, a reason why the breakage is likely to occur in the cross portion 920 will be described. FIG. 12 is a cross-sectional view, taken along the line XII-XII', of the gate portions 902 and 903 according to the second and third reference examples illustrated in FIG. 11B and FIG. 11C. The structure of upper layers overlying the gate portions 902 and 903 is omitted in the drawing. As can be seen from FIG. 12, the upper surface of the lower gate insulating layer 5 has a step st reflecting the lower gate wiring line GL1. Specifically, of the upper surface of the lower gate insulating layer 5, a portion 5s1 positioned on the first notched portion n1 is lower than a portion 5s2 positioned on the first solid portion 30, and the step st is created between these portions 5s1 and 5s2. Thus, when the upper gate wiring line GL2 is formed, via the upper gate insulating layer 9, so as to completely intersect the lower portion 5s1 of the upper surface of the lower gate insulating layer 5, a recess 51 having the portion 5s1 as a bottom surface is formed by side surfaces of the upper gate wiring line GL2 and the upper gate insulating layer 9 and the step st. In such a structure, some of the etching solution or water used for forming the upper gate wiring line GL2 may remain in the recess 51. In that case, due to the influence of the remaining etching solution or water, there is a possibility that the breakage of the upper gate wiring line GL2 may occur.

In contrast to this, the gate portion GP according to the present embodiment does not have the cross portion 920 (FIG. 11B, FIG. 11C), which may cause the breakage of the wiring line. Thus, the breakage of the upper gate wiring line GL2 can be more effectively suppressed. In the present embodiment, as illustrated in FIG. 2C and FIG. 2D, when viewed from the normal direction of the substrate 1, of the upper gate wiring line GL2, the second overlapping portion 8b overlapping the first solid portion 30 of the lower gate wiring line GL1 continuously extends between the two adjacent source wiring lines SL. In other words, when viewed from the normal direction of the substrate 1, in the upper gate wiring line GL2, a portion overlapping the entire width of the first notched portion n1 (the portion 910 illustrated in FIG. 11B and FIG. 11C) is not formed. As illustrated in the drawings, the upper gate wiring line GL2 extends in the row direction straddling the first notched portions n1 and the first solid portion 30. According to such an arrangement, the cross portion 920 (FIG. 11B, FIG. 11C) is not formed. Since the cross portion 920 is not formed, as can be seen from FIG. 2E, a recess is not formed by the side surfaces of the upper gate wiring line GL2 and the upper gate insulating layer 9 and the step st of the lower gate insulating layer 5. Therefore, the etching solution or the water is less likely to be left behind compared to the structure in which the recess 51 is formed as illustrated in FIG. 12. Thus, the breakage of the upper gate wiring line GL2 caused by the remaining etching solution or water can be suppressed.

Size of Each Component of Gate Wiring Line Structure

With reference to FIG. 2C, the size of each component of the gate portion GP will be described as an example.

It is sufficient that a length (maximum width) wn in the column direction of each of the first notched portions n1 of the lower gate wiring line GL1 be smaller than the maximum width of the first solid portion 30 of the lower gate wiring line GL1 (here, the width w31 in the column direction of the first portion 31). The length wn may be from ¼ to ¾ of the width w31, for example. By setting the length wn to be ¼ or greater of the width w31, the overlap area between the lower gate wiring line GL1 and the upper gate wiring line GL2 can be reduced. On the other hand, by setting the length wn to be ¾ or less of the width w31, an increase in the electrical resistance of the lower gate wiring line GL1 can be suppressed, the increase being caused by the first notched portions n1 being provided in the lower gate wiring line GL1.

A length x1 in the row direction of each of the first notched portions n1 is less than an interval xs of the two adjacent source wiring lines SL, and may preferably be from ¼ to ¾ of the interval xs. By setting the length x1 to be ¼ or greater of the interval xs, the overlap area between the lower gate wiring line GL1 and the upper gate wiring line GL2 can be more effectively reduced. On the other hand, by setting the length x1 to be ¾ or less of the interval xs, the breakage of the upper gate wiring line GL2 can be more reliably suppressed. Further, the oxide semiconductor layer 7 is easily disposed between the two adjacent first notched portions n1. The length x1 in the row direction of each of the first notched portions n1 may be from ½ to ⅔ of the length in the row direction of each of the first portions 31.

The interval between the two adjacent first notched portions n1 (in other words, the length x31 in the row direction of the first portion 31) is preferably greater than a width (channel width) x7 of the oxide semiconductor layer 7. The length x31 in the row direction of the first portion 31 may be twice or less than the width x7 of the oxide semiconductor layer 7, for example. The arrangement pitch of the first notched portions n1 may be set to be the same as the arrangement pitch of the source wiring lines SL, for example.

The maximum width in the column direction of the second solid portion 80 of the upper gate wiring line GL2 (here, the width w80) is less than the maximum width of the first solid portion 30 of the lower gate wiring line GL1 (here, the width w31), for example. From the perspective of reducing the electrical resistance of the upper gate wiring line GL2, the maximum width w80 may be ½ or greater of the maximum width w31 of the lower gate wiring line GL1.

A length (maximum width) wa in the column direction of the first overlapping portion 8a of the upper gate wiring line GL2 is preferably less than the length wn of the corresponding first notched portion n1. In this way, the breakage and peeling of the upper gate wiring line GL2 can be more reliably suppressed. The length wa may be ¼ or greater and less than 1 of the length wn, for example. Alternatively, the length wa may be ¼ or greater and less than ¾ of the width w80 of the upper gate wiring line GL2.

The length xa in the row direction of each of the first overlapping portions 8a is preferably the same as the length x1 of the corresponding first notched portion n1. In other words, one of the edge portions of the upper gate wiring line GL2, that is, the edge portion e3, is preferably disposed so as to extend across the first notched portions n1.

MODIFIED EXAMPLES

Modified examples of the gate portion GP according to the present embodiment will be described below. In the drawings illustrating the modified examples, the same reference numerals are assigned to the same constituent elements as those illustrated in FIG. 2C. In order to avoid redundancy in the description, in the following description, differences from the configuration of the gate portion GP described with reference to FIG. 2C and FIG. 2D will be mainly described.

First Modified Example

Figure 3:
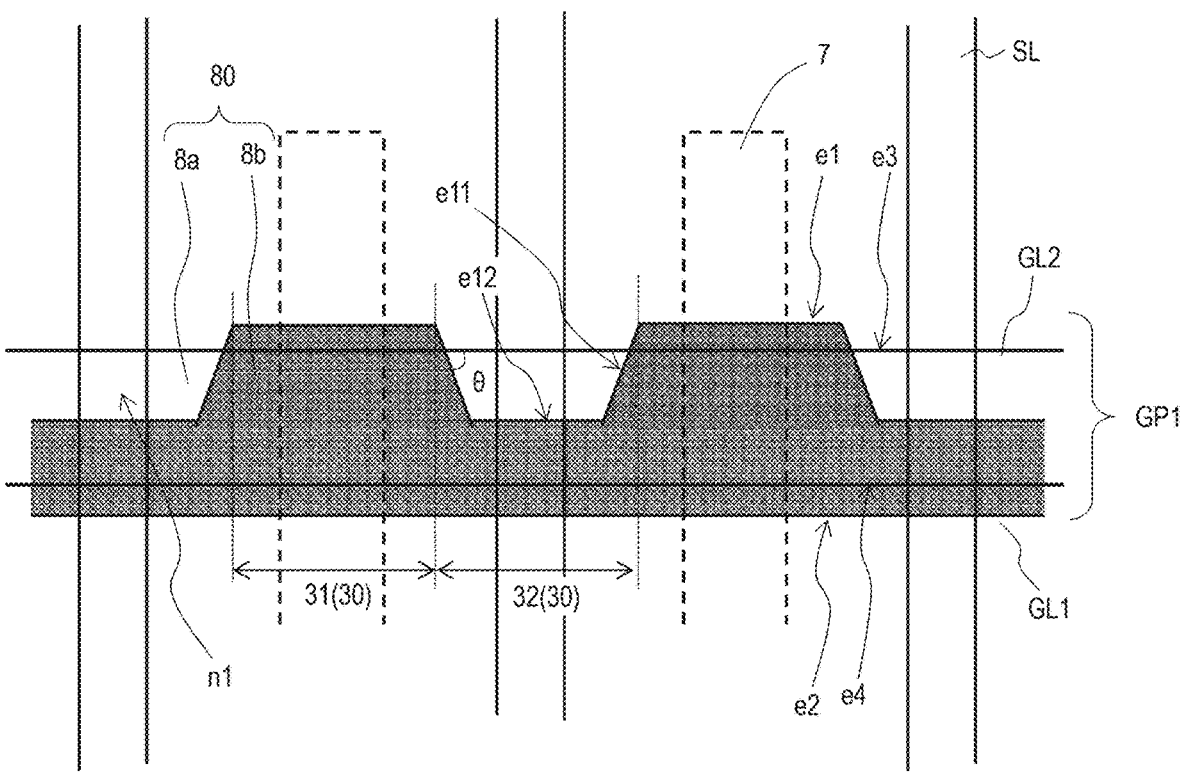
FIG. 3 is an enlarged cross-sectional view of a gate portion GP1 of a first modified example.

FIG. 3 is a plan view illustrating a gate portion GP1 of a first modified example.

In the gate portion GP1 of the first modified example, when viewed from the normal direction of the substrate 1, at least one of the edge portions of the first solid portion 30 of the lower gate wiring line GL1 (here, the edge portion e1) includes an inclined portion e11 that extends in an inclined manner in both the row direction and the column direction. The inclined portion e11 may be a linear portion, or may include a curved line portion. One of the edge portions of the upper gate wiring line GL2 (here, the edge portion e3) intersects each of the inclined portions e11. In this way, the occurrence of the breakage of the upper gate wiring line GL2 due to the step of the lower gate wiring line GL1 can more effectively be suppressed.

In the illustrated example, when viewed from the normal direction of the substrate 1, a portion, of the edge portion e1 of the lower gate wiring line GL1, that defines the first notched portion n1 includes a portion e12 extending in the row direction and two of the inclined portions e11 positioned at both sides of the portion e12. When viewed from the normal direction of the substrate 1, the edge portion e3 of the upper gate wiring line GL2 intersects the two inclined portions e11 that define each of the first notched portions n1. When viewed from the normal direction of the substrate 1, of the upper gate wiring line GL2, the first overlapping portion 8a overlapping the first notched portion n1 includes a corner portion formed by the edge portion e3 and the inclined portion e11. An angle (internal angle) θ of the corner portion may be from 45° to 90°, for example.

Second to Fourth Modified Examples

In second to fourth modified examples, the respective gate portions differ from the gate portion GP of the active matrix substrate 101 illustrated in FIG. 2A and FIG. 2B in that, when viewed from the normal direction of the substrate 1, the upper gate wiring line GL2 further includes a plurality of second notched portions n2.

Figure 4A:
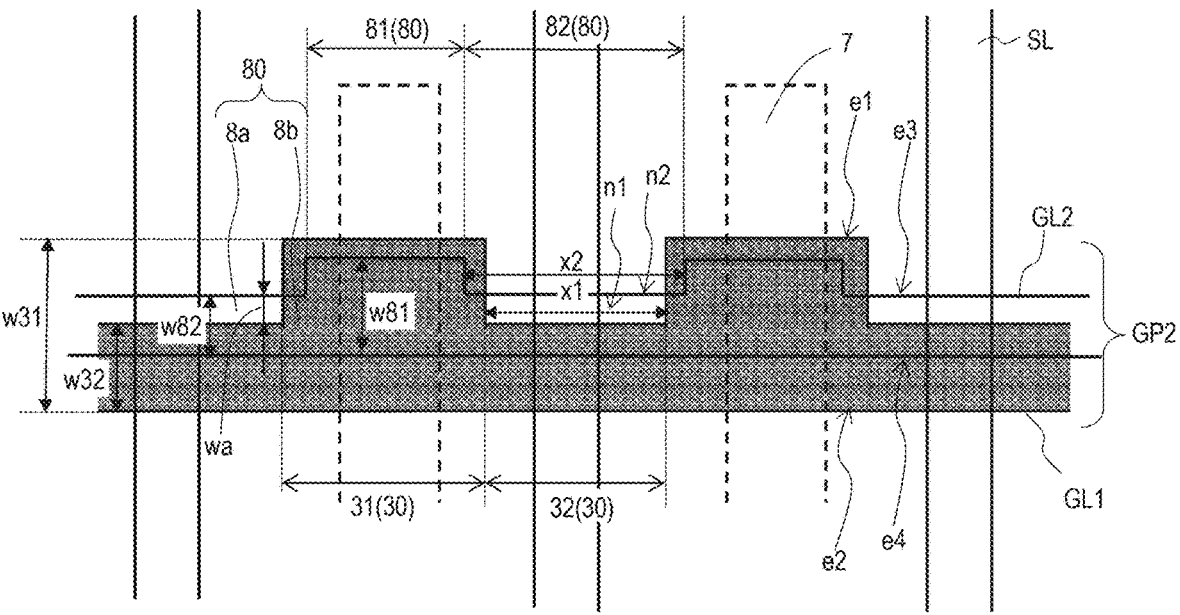
FIG. 4A is an enlarged cross-sectional view of a gate portion GP2 of a second modified example.
Figure 4B:
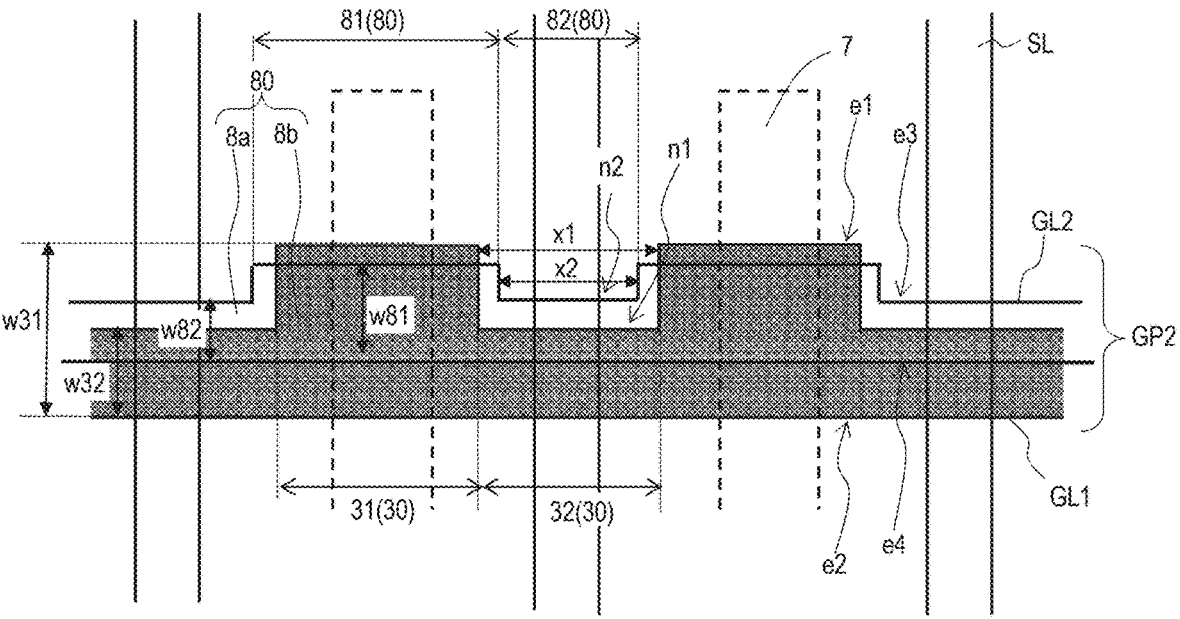
FIG. 4B is an enlarged cross-sectional view of another form of the gate portion GP2 of the second modified example.

FIG. 4A and FIG. 4B are each a plan view illustrating a gate portion GP2 of the second modified example.

In the gate portion GP2, when viewed from the normal direction of the substrate 1, the upper gate wiring line GL2 includes the plurality of second notched portions n2 disposed spaced apart from each other, and the second solid portion 80 that is a portion other than the second notched portions n2. When viewed from the normal direction of the substrate 1, the second solid portion 80 of the upper gate wiring line GL2 includes the edge portions e3 and e4 extending in the row direction while facing each other. At least one of edge portions of the upper gate wiring line GL2 (here, the edge portion e3) is bent into a convex shape toward the edge portion on the opposite side, so as to form a recessed portion that defines the second notched portion n2. When viewed from the normal direction of the substrate 1, the second notched portion n2 at least partially overlaps one of the plurality of first notched portions n1 of the lower gate wiring line GL1.

In the illustrated example, the second solid portion 80 of the upper gate wiring line GL2 includes a plurality of third portions 81 disposed spaced apart from each other in the row direction, and a plurality of fourth portions 82 each of which is positioned between two of the third portions 81 adjacent to each other. Each of the fourth portions 82 is a portion overlapping one of the second notched portions n2 in the column direction. In other words, the position of the fourth portion 82 in the row direction is the same as that of the one of the second notched portions n2. A width w81 of the third portion 81 of the upper gate wiring line GL2 may be greater than a width w82 of the fourth portion 82.

The third portion 81 of the upper gate wiring line GL2 may at least partially overlap the first portion 31 of the lower gate wiring line GL1, and the fourth portion 82 of the upper gate wiring line GL2 may at least partially overlap the second portion 32 of the lower gate wiring line GL1. In this case, when viewed from the normal direction of the substrate 1, by disposing the oxide semiconductor layer 7 so as to extend across the third portion 81 and the first portion 31, a desired channel length can be secured. Further, by disposing the source wiring line SL so as to extend across the fourth portion 82 and the second portion 32, the parasitic capacitance formed between the source wiring line SL and the upper gate wiring line GL2 can be reduced.

In the example illustrated in FIG. 4A, a length x2 in the row direction of each of the second notched portions n2 is greater than the length x1 in the row direction of the corresponding first notched portion n1 of the lower gate wiring line GL1. Each of the second notched portions n2 extends across the corresponding first notched portion n1 of the lower gate wiring line GL1. Each of the third portions 81 of the upper gate wiring line GL2 may be positioned inside one of the plurality of first portions 31 of the lower gate wiring line GL1.

As illustrated in FIG. 4B, the length x2 in the row direction of each of the second notched portions n2 may be smaller than the length x1 in the row direction of the corresponding first notched portion n1 of the lower gate wiring line GL1. In this case, when viewed from the normal direction of the substrate 1, each of the second notched portions n2 may be positioned inside the corresponding first notched portion n1.

According to the second modified example, the area of the first overlapping portion 8a of the upper gate wiring line GL2 can be reduced while securing the maximum width w81 of the upper gate wiring line GL2, which is the channel length of the TFT, and the breakage of the upper gate wiring line GL2 can thus be suppressed.

Figure 5A:
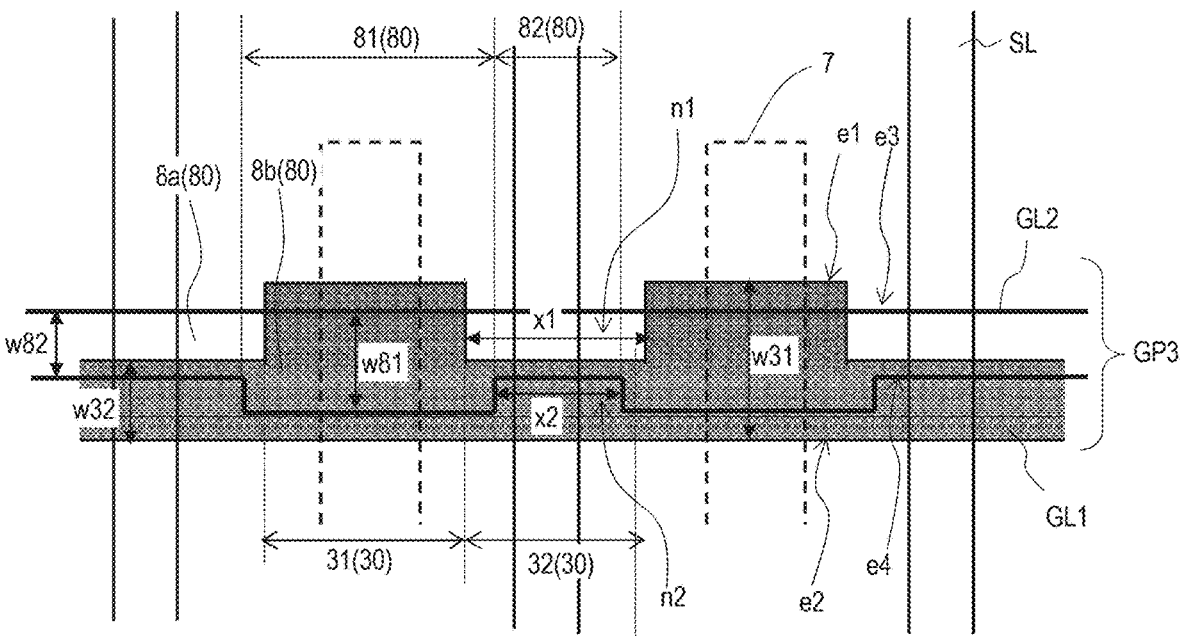
FIG. 5A is an enlarged cross-sectional view of a gate portion GP3 of a third modified example.
Figure 5B:
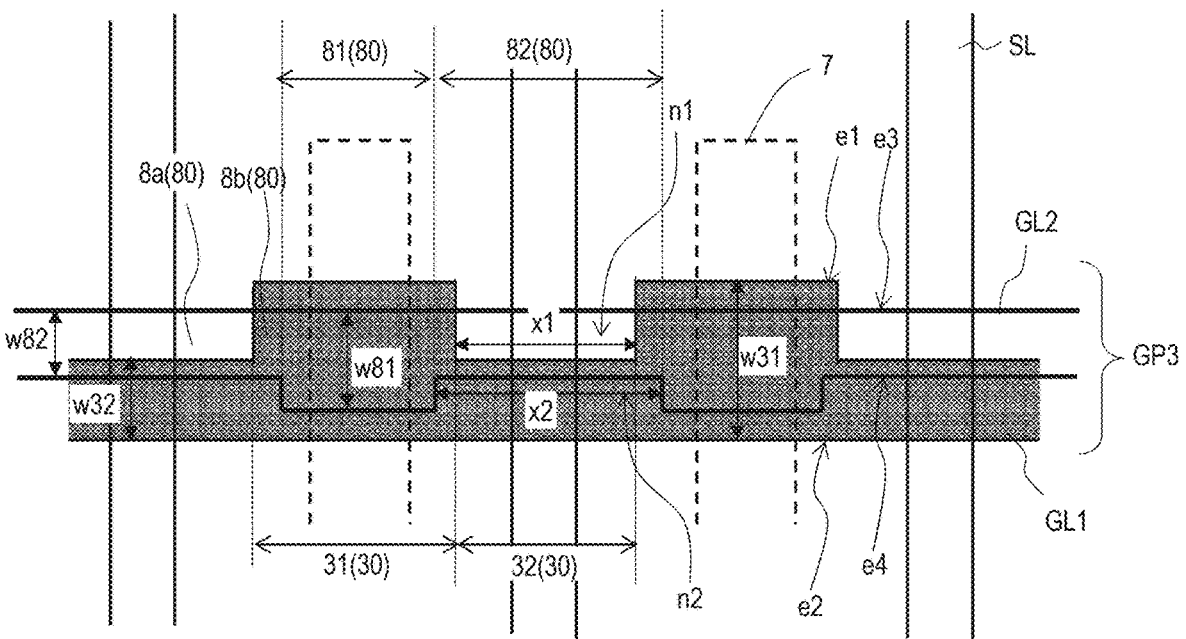
FIG. 5B is an enlarged cross-sectional view of another form of the gate portion GP3 of the third modified example.

FIG. 5A and FIG. 5B are each a plan view illustrating a gate portion GP3 of the third modified example.

In the gate portion GP3, when viewed from the normal direction of the substrate 1, the recessed portions defining the second notched portions n2 are formed so as to be separated from each other, only at the edge portion e4 of the upper gate wiring line GL2. When viewed from the normal direction of the substrate 1, each of the second notched portions n2 overlaps one of the plurality of first notched portions n1 of the lower gate wiring line GL1 in the column direction. In this example, these notched portions n1 and n2 are positioned adjacent to each other with the second overlapping portion 8b interposed therebetween in the column direction.

Similarly to the second modified example, in the third modified example also, the third portion 81 of the upper gate wiring line GL2 may at least partially overlap the first portion 31 of the lower gate wiring line GL1, and the fourth portion 82 of the upper gate wiring line GL2 may at least partially overlap the second portion 32 of the lower gate wiring line GL1.

As illustrated in FIG. 5A, the length x2 in the row direction of each of the second notched portions n2 may be smaller than the length x1 in the row direction of the corresponding first notched portion n1 of the lower gate wiring line GL1. Alternatively, as illustrated in FIG. 5B, the length x2 in the row direction of each of the second notched portions n2 may be greater than the length x1 in the row direction of the corresponding first notched portion n1 of the lower gate wiring line GL1.

According to the third modified example, by providing the second notched portions n2 in the upper gate wiring line GL2, the area (overlap area) of the second overlapping portion 8b of the upper gate wiring line GL2 can be reduced while securing the maximum width w81 of the upper gate wiring line GL2, which is the channel length of the TFT, and the parasitic capacitance can thus be further reduced.

Figure 6A:
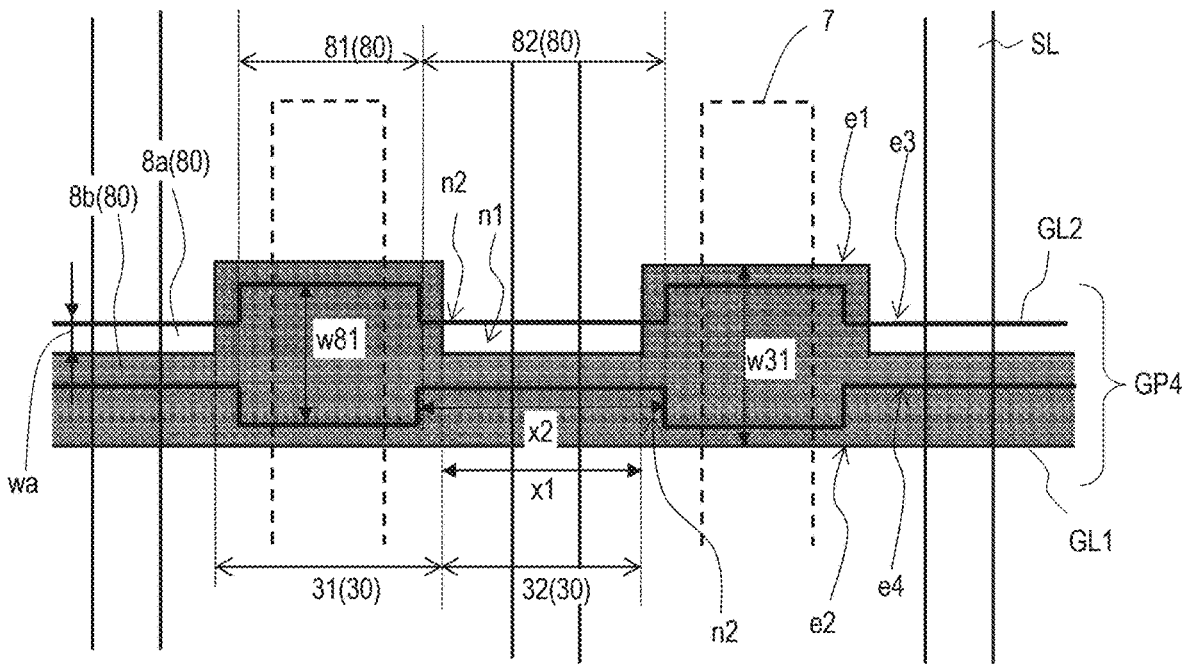
FIG. 6A is an enlarged cross-sectional view of a gate portion GP4 of a fourth modified example.
Figure 6B:
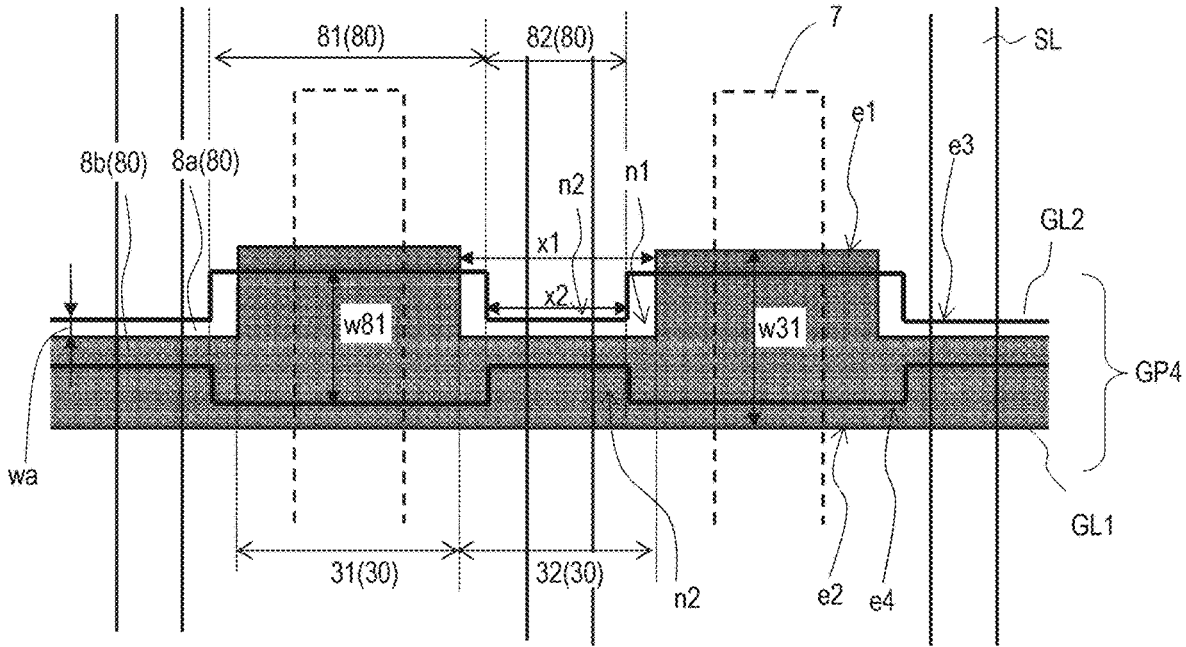
FIG. 6B is an enlarged cross-sectional view of another form of the gate portion GP4 of the fourth modified example.

FIG. 6A and FIG. 6B are each a plan view illustrating a gate portion GP4 of the fourth modified example.

The gate portion GP4 differs from the second and third modified examples described above in that, when viewed from the normal direction of the substrate 1, the recessed portions defining the second notched portions n2 are formed at both the edge portions e3 and e4 of the upper gate wiring line GL2.

When viewed from the normal direction of the substrate 1, each of the second notched portions n2 on the edge portion e3 side may be adjacent to one of the second notched portions n2 on the edge portion e4 side in the column direction, with the second overlapping portion 8b interposed therebetween. In this way, the area (overlap area) of the second overlapping portion 8b of the upper gate wiring line GL2 can be further reduced while keeping the area of the first overlapping portions 8a of the upper gate wiring line GL2 small.

As illustrated in FIG. 6A, the length x2 in the row direction of each of the second notched portions n2 may be greater than the length x1 in the row direction of the corresponding first notched portion n1 of the lower gate wiring line GL1. Alternatively, as illustrated in FIG. 6B, the length x2 in the row direction of each of the second notched portions n2 may be smaller than the length x1 in the row direction of the corresponding first notched portion n1 of the lower gate wiring line GL1. Although not illustrated, the second notched portion n2 positioned on the edge portion e3 side and the second notched portion n2 positioned on the edge portion e4 side may be different from each other in shape and size.

In the second to fourth modified examples also, the maximum width (here, the width w31 of the first portion 31) of the lower gate wiring line GL1 between the two adjacent source wiring lines SL may be greater than the maximum width (here, the width w81 of the third portion 81) of the upper gate wiring line GL2. When viewed from the normal direction of the substrate 1, by disposing the third portion 81 on the first portion 31, the width in the channel length direction of the lower gate electrode GE1, which can function as the light blocking layer, can be made greater than the channel length of the TFT.

Further, a difference between the width w81 of the third portion 81 and the width w82 of the fourth portion 82 in the upper gate wiring line GL2 may be smaller than a difference between the width w31 of the first portion 31 and the width w32 of the second portion 32 in the lower gate wiring line GL1. In this way, the first overlapping portion 8a is easily formed in the upper gate wiring line GL2.

Fifth Modified Example

Figure 7A:
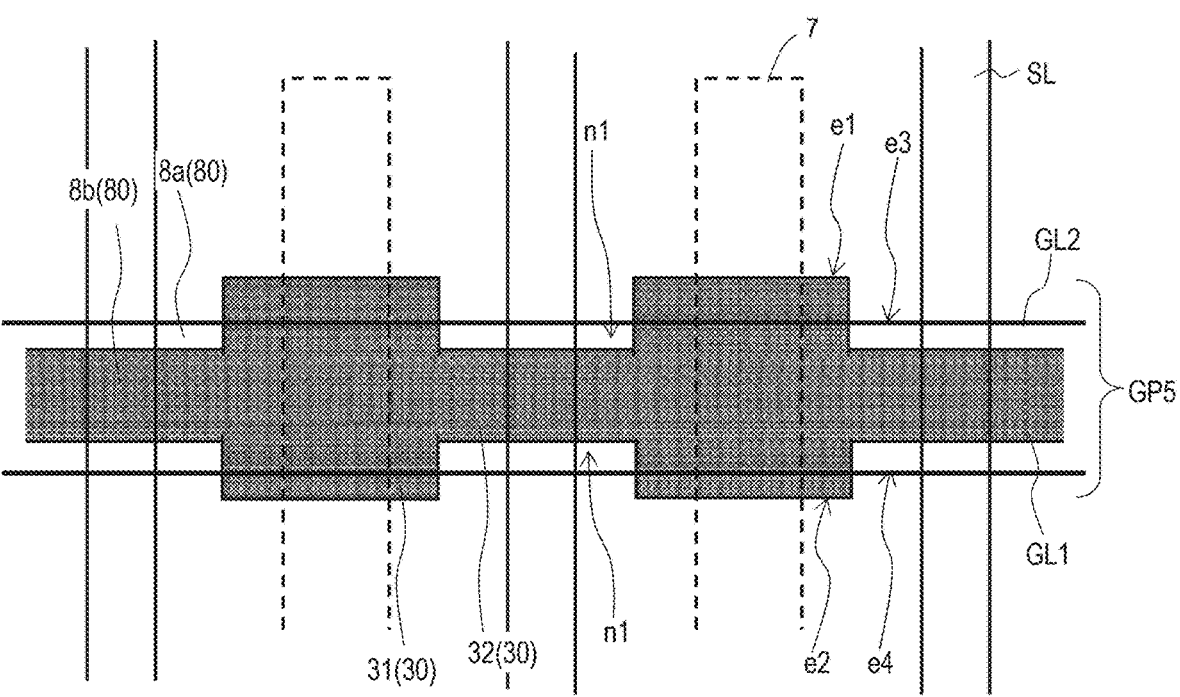
FIG. 7A is an enlarged cross-sectional view of a gate portion GP5 of a fifth modified example.
Figure 7B:
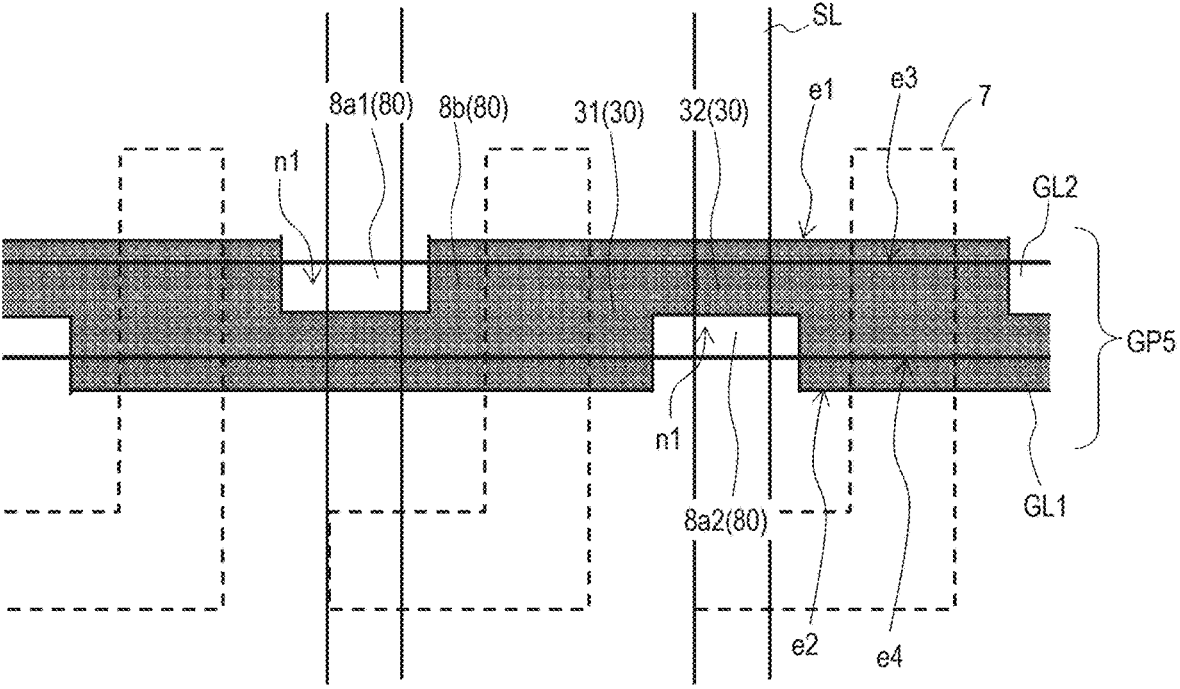
FIG. 7B is an enlarged cross-sectional view of another form of the gate portion GP5 of the fifth modified example.
Figure 7C:
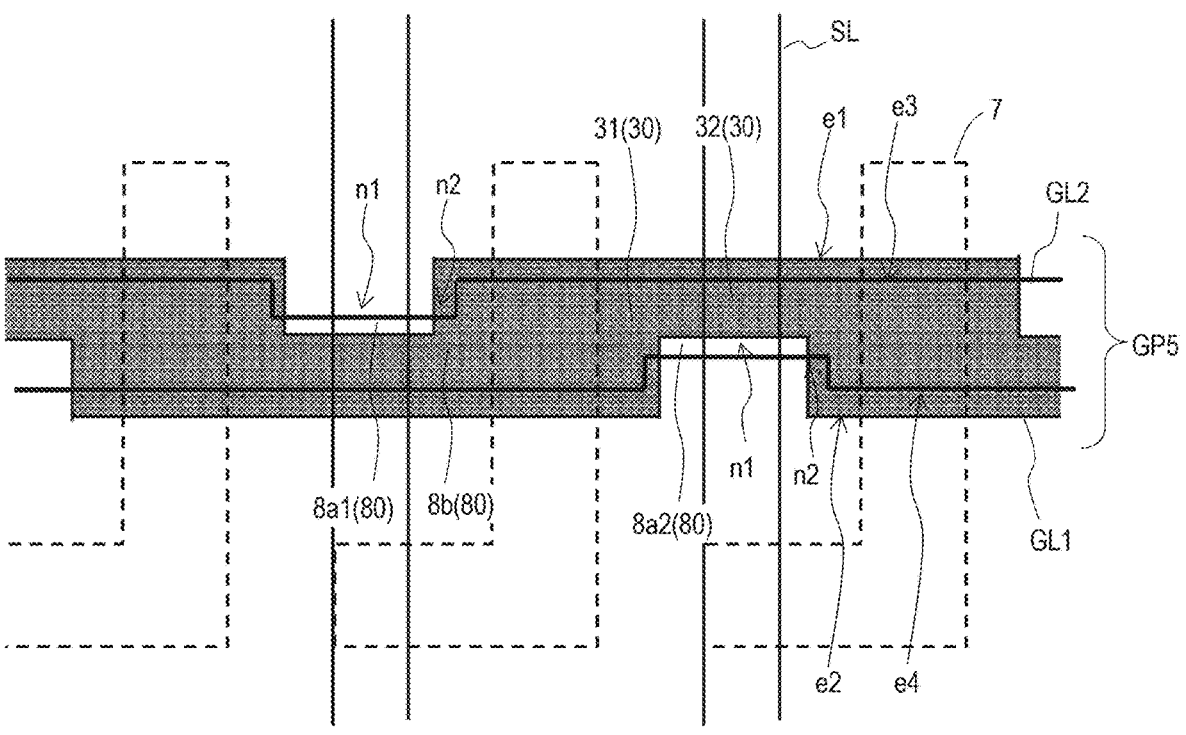
FIG. 7C is an enlarged cross-sectional view of yet another form of the gate portion GP5 of the fifth modified example.

FIG. 7A to FIG. 7C are each a plan view illustrating a gate portion GP5 of a fifth modified example.

The gate portion GP5 differs from the gate portion GP illustrated in FIG. 2C in that the first notched portion n1 is also formed on the edge portion e2 side of the lower gate wiring line GL1.

In the gate portion GP5, when viewed from the normal direction of the substrate 1, the recessed portions defining the first notched portions n1 are formed at both the edge portions e1 and e2 of the lower gate wiring line GL1.

In the example illustrated in FIG. 7A, when viewed from the normal direction of the substrate 1, one of the first notched portions n1 positioned on the edge portion e1 side and one of the first notched portions n1 positioned on the edge portion e2 side are adjacent to each other in the column direction, with the first solid portion 30 interposed therebetween. In this way, the overlap area between the second solid portion 80 of the upper gate wiring line GL2 and the first solid portion 30 of the lower gate wiring line GL1 can be further reduced.

In the example illustrated in FIG. 7B, when viewed from the normal direction of the substrate 1, each of the first notched portions n1 positioned on the edge portion e1 side is disposed so as not to overlap any of the first notched portions n1 positioned on the edge portion e2 side in the column direction. In the upper gate wiring line GL2, first overlapping portions 8a1 positioned on the edge portion e3 side and first overlapping portions 8a2 positioned on the edge portion e4 side are alternately disposed in the row direction.

When viewed from the normal direction of the substrate 1, the oxide semiconductor layer 7 may extend, in the column direction, between the first overlapping portion 8a1 on the edge portion e3 side and the first overlapping portion 8a2 on the edge portion e4 side.

The example illustrated in FIG. 7C differs from the example illustrated in FIG. 7B in that the second notched portions n2 are formed in the upper gate wiring line GL2. In the example illustrated in FIG. 7C, when viewed from the normal direction of the substrate 1, the recessed portions defining the second notched portions n2 are formed at both the edge portion e3 and the edge portion e4 of the upper gate wiring line GL2. When viewed from the normal direction of the substrate 1, the second notched portions n2 positioned on the edge portion e3 side and the edge portion e4 side partially overlap the first notched portions n1 positioned on the edge portion e1 side and the edge portion e2 side of the lower gate wiring line GL1, respectively. In this way, the areas of the first overlapping portions 8a1 and 8a2 of the upper gate wiring line GL2 can be reduced, and the breakage of the upper gate wiring line GL2 can thus be more effectively suppressed.

Other Modified Examples

Figure 8A:
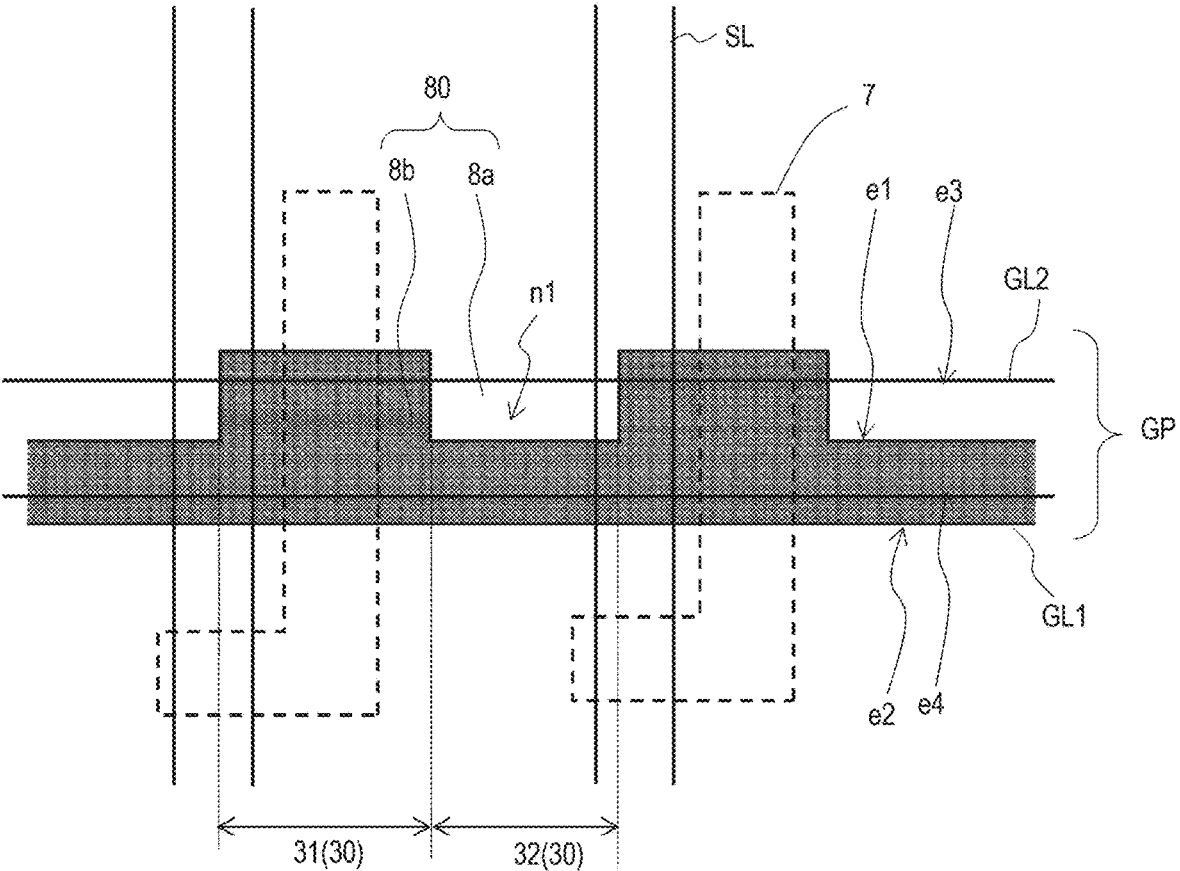
FIG. 8A is an enlarged cross-sectional view of another form of the gate portion GP.

In each of the examples described above, one of the first portions 31 of the lower gate wiring line GL1 and parts of the two second portions 32 positioned at both sides of the first portion 31 are disposed between the two adjacent source wiring lines SL, but the arrangement relationship between the source wiring line SL and the gate portion GP is not limited to this example. It is sufficient that at least a part of the first notched portion n1 is disposed between the two adjacent source wiring lines SL. For example, as illustrated in FIG. 8A, a part of the first portion 31 and a part of the second portion 32 of the lower gate wiring line GL1 may be disposed between the two adjacent source wiring lines SL.

Figure 8B:
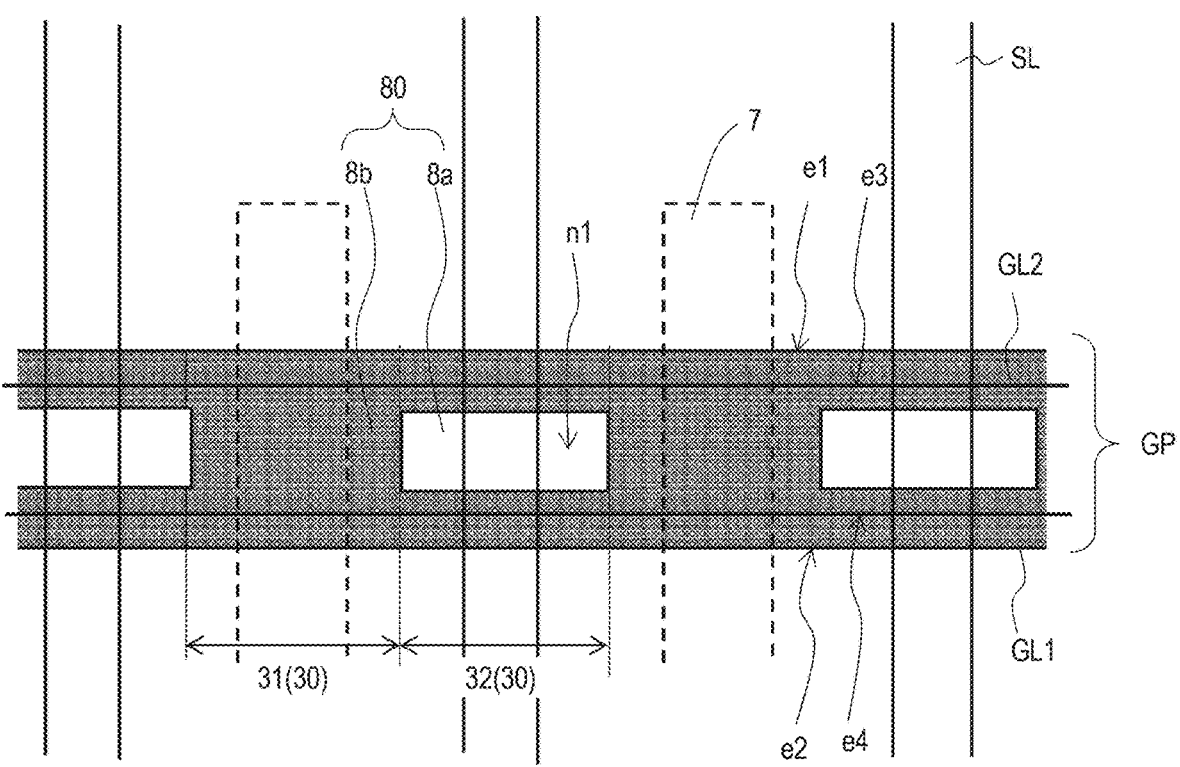
FIG. 8B is an enlarged cross-sectional view of another form of the gate portion GP.

Further, as illustrated in FIG. 8B, when viewed from the normal direction of the substrate 1, the first notched portion n1 may be an opening surrounded by the first solid portion 30 of the lower gate wiring line GL1. In this case, it is sufficient that each of the first notched portions n1 be disposed so as not to overlap the oxide semiconductor layer 7 when viewed from the normal direction of the substrate 1. In the illustrated example, each of the first notched portions n1 overlaps the source wiring line SL, but need not necessarily overlap the source wiring line SL. Although not illustrated, only some of the plurality of first notched portions n1 of the lower gate wiring line GL1 may be the openings, and the others may be the recessed portions.

Furthermore, although not illustrated, the plurality of first notched portions n1 may include two or more types of the first notched portions n1 that are different in size from each other. Similarly, the plurality of second notched portions n2 may include two or more types of the second notched portions n2 that are different in size from each other. Further, some or all of the second notched portions n2 may be openings positioned inside the second solid portion 80.

Gate Wiring Line Connection Section GC

As described above, the active matrix substrate 101 includes the gate wiring line connection section GC that connects the lower gate wiring line GL1 and the upper gate wiring line GL2 for each of the gate portions GP. As illustrated in FIG. 1, two of the gate wiring line connection sections GC may be provided for one of the gate portions.

Figure 9A:
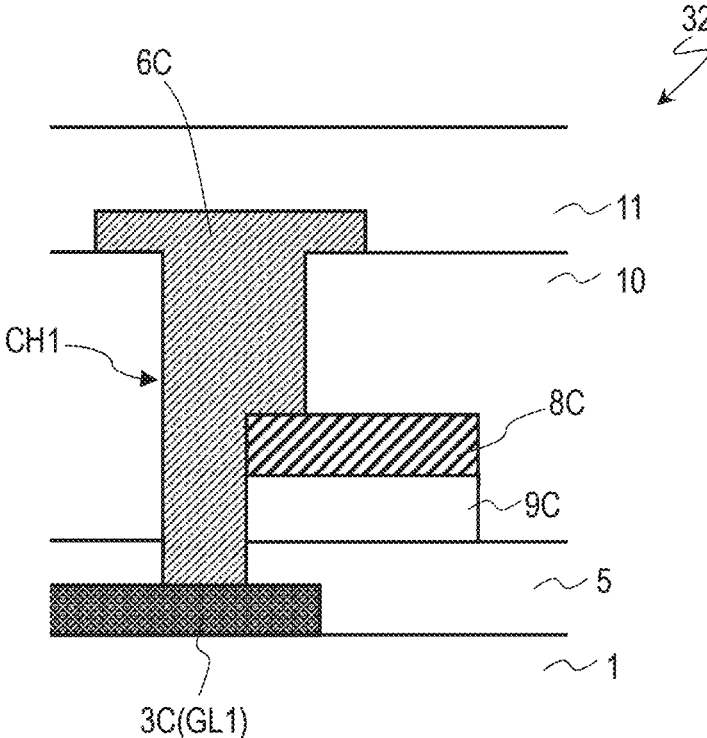
FIG. 9A is a cross-sectional view of a gate wiring line connection section GC.
Figure 9B:
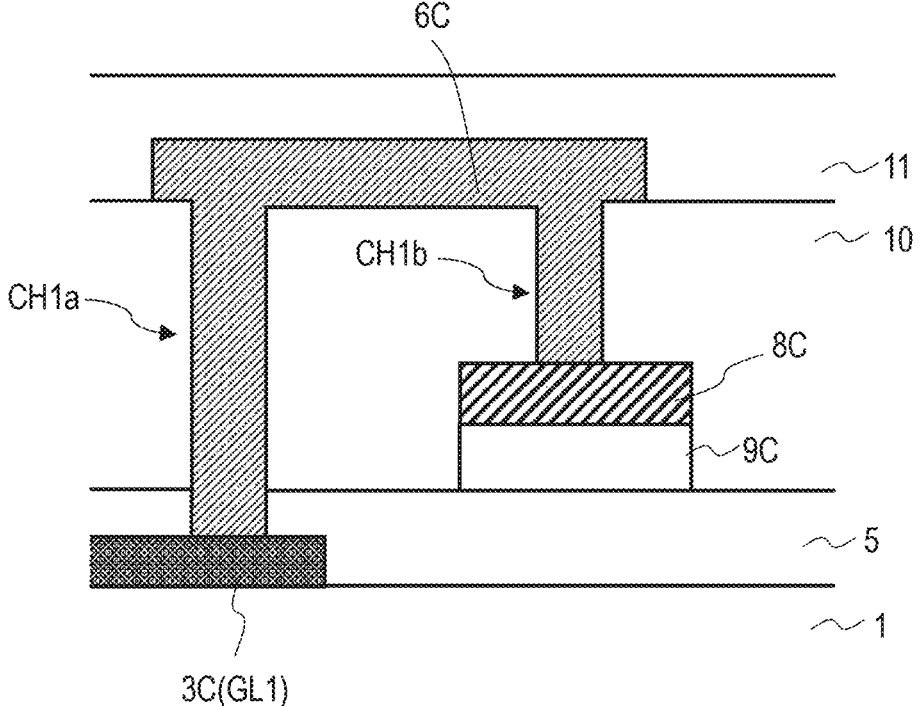
FIG. 9B is a cross-sectional view of another form of the gate wiring line connection section GC.

FIG. 9A and FIG. 9B are each a schematic cross-sectional view of the gate wiring line connection section GC. In the example illustrated in FIG. 9A and FIG. 9B, in each of the gate wiring line connection sections GC, the corresponding lower gate wiring line GL1 in the first metal layer M1 and the upper gate wiring line GL2 disposed in the second metal layer M2 are electrically connected to each other via a connection electrode 6C disposed in the third metal layer M3.

The gate wiring line connection section GC illustrated in FIG. 9A includes a lower connection section 3C, an upper connection section 8C disposed on a part of the lower connection section 3C with the lower gate insulating layer 5 and an upper gate insulating layer 9C interposed therebetween, the interlayer insulating layer 10 provided to extend on the upper connection section 8C, a wiring line contact hole CH1 formed in an insulating layer including the interlayer insulating layer 10 (here, the interlayer insulating layer 10 and the lower gate insulating layer 5), and the connection electrode 6C formed on the interlayer insulating layer 10. The connection electrode 6C is formed, for example, in the third metal layer M3.

The lower connection section 3C is connected to the lower gate wiring line GL1. The lower connection section 3C may be a part of the lower gate wiring line GL1, or may be a connection section integrally formed with the lower gate wiring line GL1. The upper connection section 8C is connected to the upper gate wiring line GL2. The upper connection section 8C may be a part of the upper gate wiring line GL2, or may be a connection section integrally formed with the upper gate wiring line GL2. The connection electrode 6C is formed, for example, in the same metal layer as the source wiring line SL, the source electrode SE, and the drain electrode DE. The connection electrode 6C is electrically separated from the source wiring line SL, the source electrode SE, and the drain electrode DE.

The wiring line contact hole CH1 exposes a part of the lower connection section 3C and a part of the upper connection section 8C. The wiring line contact hole CH1 may be formed by the same etching process used for the first opening 10s and the second opening 10d of each of the TFTs 20.

The connection electrode 6C is disposed on the interlayer insulating layer 10 and in the wiring line contact hole CH1, and is in direct contact with an exposed portion of the upper connection section 8C and an exposed portion of the lower connection section 3C in the wiring line contact hole CH1. The third metal layer M3 including the connection electrode 6C is covered by the inorganic insulating layer 11. In the non-display region, an organic insulating layer may not be formed on the inorganic insulating layer 11.

Note that it is sufficient that the connection electrode 6C be disposed above the interlayer insulating layer 10, and may be formed in another metal layer different from the second metal layer M2. For example, in an active matrix substrate to be used in an in-cell touch panel, a metal layer for forming wiring lines for the touch panel may be separately provided. The connection electrode 6C may be formed in the same metal layer as the wiring lines for the touch panel. Alternatively, the connection electrode 6C may be a transparent electrode formed in the same layer as the pixel electrode PE or the common electrode CE.

The structure of the gate wiring line connection section GC is not limited to the example illustrated in FIG. 9A. As illustrated in FIG. 9B, in the gate wiring line connection section GC, a wiring line contact hole CH1a for electrically connecting the lower connection section 3C and the connection electrode 6C, and a wiring line contact hole CH1b for electrically connecting the upper connection section 8C and the connection electrode 6C may be provided separately with an interval therebetween.

In the example illustrated in FIG. 1, the gate wiring line connection sections GC are disposed in the non-display region, but the gate wiring line connection section GC may be disposed in the display region.

Manufacturing Method of Active Matrix Substrate 101

FIG. 10A to FIG. 10M are schematic process cross-sectional views for describing a method for manufacturing the active matrix substrate 101. These drawings illustrate a TFT formation region r1 in which the pixel TFT is formed in each of the pixel areas, and a connection section formation region r2 in which each of the gate wiring line connection sections GC is formed.

STEP 1: Forming First Metal Layer M1 (FIG. 10A)

A first conductive film (having a thickness from 50 nm to 500 nm, for example) is formed on the substrate 1 by sputtering, for example. Subsequently, patterning (for example, wet etching) of the first conductive film is performed by a known photolithography step. In this manner, as illustrated in FIG. 10A, the first metal layer M1 including the lower gate wiring line GL1 and the lower connection section 3C is formed.

As the substrate 1, a transparent substrate with insulating properties, for example, a glass substrate, a silicon substrate, a heat-resistant plastic substrate (resin substrate), or the like can be used.

The material of the first conductive film is not limited, and a film containing metal such as aluminum (Al), tungsten (W), molybdenum (Mo), tantalum (Ta), chromium (Cr), titanium (Ti), copper (Cu) or the like, an alloy thereof, or metal nitride thereof can be appropriately used. Further, a layered film obtained by layering such a plurality of films may be used.

Here, a single-layer film of a metal film (or an alloy film) containing Cu or Al is used as the first conductive film. Alternatively, a layered film having a metal film containing Cu or Al as a top layer, or a layered film containing Cu and Ti may be used.

STEP 2: Forming Lower Gate Insulating Layer 5 (FIG. 10B)

Subsequently, as illustrated in FIG. 10B, the lower gate insulating layer 5 (having a thickness from 200 nm to 600 nm, for example) is formed to cover the first metal layer M1 in the TFT formation region r1 and the connection section formation region r2.

The lower gate insulating layer 5 is formed by the CVD method, for example. As the lower gate insulating layer 5, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The lower gate insulating layer 5 may be a single layer or may have a layered structure. For example, a silicon nitride (SiNx) layer, a silicon nitride oxide layer, or the like may be formed on a substrate side (as a lower layer) in order to prevent diffusion of impurities and the like from the substrate 1, and a silicon oxide (SiO₂) layer, a silicon oxynitride layer, or the like may be formed on the top of the lower layer (as an upper layer) in order to ensure insulating properties. Here, a silicon oxide (SiO₂) layer (having a thickness of 350 nm, for example) is formed as the lower gate insulating layer 5 by the CVD method, for example. Alternatively, a layered film having a silicon nitride (SiNx) layer (having a thickness from 50 to 600 nm) as a lower layer and a silicon oxide (SiO₂) layer (having a thickness from 50 to 600 nm) as an upper layer may be formed as the lower gate insulating layer 5. When an oxide film such as a silicon oxide film is used as the lower gate insulating layer 5 (or as the top layer of the lower gate insulating layer 5 when the lower gate insulating layer 5 has a layered structure), the oxide film can reduce an oxidation deficit generated in a channel region of the oxide semiconductor layer, which will be formed later, and thus, lowering of resistance of the channel region can be suppressed.

STEP 3: Forming Oxide Semiconductor Layer 7 (FIG. 10C)

Subsequently, an oxide semiconductor film (having a thickness from 15 nm to 200 nm, for example) is formed on the lower gate insulating layer 5. Thereafter, annealing treatment of the oxide semiconductor film may be performed. Subsequently, the oxide semiconductor film is patterned by the known photolithography step. In this way, as illustrated in FIG. 10C, the oxide semiconductor layer 7, which will become the active layer of the TFT 20, is obtained in the TFT formation region r1.

The oxide semiconductor film may be formed by a sputtering method that uses, for example, a sputtering target having a desired composition. Here, as the oxide semiconductor film, an In—Ga—Zn—O-based semiconductor film (having a thickness of 50 nm) film containing In, Ga, and Zn is formed. As the sputtering target, for example, a sputtering target having a ratio of the numbers of atoms In:Ga:Zn of 1:1:1 may be used.

Patterning of the oxide semiconductor film may be, for example, performed by wet etching using a PAN-based etching solution containing phosphoric acid, nitric acid, and acetic acid. Alternatively, other etching solutions such as oxalic acid-based etching solutions may be used for the patterning.

STEP 4: Forming Gate Insulating Film 90 (FIG. 10D)

Subsequently, as illustrated in FIG. 10D, a gate insulating film 90 is formed to cover the oxide semiconductor layer 7 in the TFT formation region r1 and the connection section formation region r2.

As the gate insulating film 90, an insulating film similar to the lower gate insulating layer 5 (an insulating film exemplified as the lower gate insulating layer 5) can be used. Here, a silicon oxide (SiO₂) film is formed as the gate insulating film 90. When an oxide film such as a silicon oxide film is used as the gate insulating film 90, the oxidation deficit generated in the channel region of the oxide semiconductor layer 7 can be reduced by the oxide film, and thus, the lowering of resistance of the channel region can be suppressed.

STEP 5: Forming Second Metal Layer M2 (FIG. 10E, FIG. 10F)

Subsequently, a second conductive film (having a thickness from 50 nm to 500 nm, for example) m2 is formed on the gate insulating film 90, for example, by sputtering or the like.

As the second conductive film m2, a metal such as molybdenum (Mo), tungsten (W), aluminum (Al), copper (Cu), titanium (Ti), or tantalum (Ta), or an alloy thereof can be used, for example. The second conductive film m2 may have a layered structure including a plurality of layers formed of different conductive materials. Here, as the second conductive film m2, a Cu/Cu alloy layered film having a metal film containing Cu or Al as a lower layer and a Cu film as an upper layer, a Cu/Ti layered film having a Ti film as a lower layer and a Cu film as an upper layer, or a Cu/Mo layered film having a Mo film as a lower layer and a Cu film as an upper layer is used.

Thereafter, as illustrated in FIG. 10F, the second conductive film m2 is patterned by the known photolithography step. Here, a resist film is formed on the second conductive film m2, and the resist film is exposed to light by using a gate photomask to form a resist layer R. Etching (for example, wet etching) of the second conductive film m2 is performed using the resist layer R as a mask. In this way, the second metal layer M2 including the upper gate wiring line GL2 and the upper connection section 8C is obtained.

STEP 6: Patterning Upper Gate Insulating Layers 9 and 9C (FIG. 10G)

Subsequently, patterning (dry etching) of the gate insulating film 90 is performed using, as a mask, the resist layer R described above to form the upper gate insulating layers 9 and 9C. When viewed from the normal direction of the substrate 1, side surfaces of the gate electrode GE may be aligned with side surfaces of the upper gate insulating layer 9, and side surfaces of the upper connection section 8C may be aligned with side surfaces of the upper gate insulating layer 9C.

The etching conditions of the gate insulating film 90 are not particularly limited, but are preferably adjusted to be conditions that can suppress overetching of the lower gate insulating layer 5.

Note that patterning of the gate insulating film 90 and the second conductive film m2 may be performed separately. Specifically, after patterning the second conductive film and peeling off the resist, patterning of the gate insulating film 90 may be performed by performing a lithography process and etching on the gate insulating film 90. Alternatively, before forming the second conductive film m2, patterning of the gate insulating film 90 is performed to form the upper gate insulating layers 9 and 9C. Subsequently, the second conductive film m2 may be formed to cover the upper gate insulating layers 9 and 9C, and the second metal layer M2 may be formed by patterning the second conductive film m2.

STEP 7: Resistance Lowering Processing of Oxide Semiconductor Layer 7

Subsequently, resistance lowering processing of the oxide semiconductor layer 7 is performed. Plasma processing may be performed as the resistance lowering processing, for example. In this way, when viewed from the normal direction of the main surface of the substrate 1, regions (exposed regions) of the oxide semiconductor layer 7 overlapping neither the gate electrode GE nor the upper gate insulating layer 9 become low-resistance regions having a lower specific resistance than that of the region (here, the region serving as the channel) overlapping the gate electrode GE and the upper gate insulating layer 9. In this manner, the oxide semiconductor layer 7 including the first region 7s and the second region 7d that are the low-resistance regions, and the channel region 7c is obtained. The resistance in the channel region 7c is not reduced, and the channel region 7c remains as a semiconductor region. The low-resistance region may be a conductor region (having a sheet resistance of 200Ω/□ or less, for example).

Note that the resistance lowering processing (plasma processing) is not limited to the method described above. For example, the exposed region of the oxide semiconductor layer 7 may be lowered in resistance by using plasma containing reducing plasma or a doping element (for example, argon plasma). The method and conditions of resistance lowering processing are described in JP 2008-40343 A, for example. The entire contents of the disclosure of JP 2008-40343 A are incorporated in the present specification by reference.

STEP 8: Forming Interlayer Insulating Layer 10 (FIG. 10H)

Subsequently, the interlayer insulating layer 10 that covers the oxide semiconductor layer 7, the upper gate insulating layer 9, and the gate electrode GE is formed. Thereafter, the interlayer insulating layer 10 is patterned by the known photolithography step. In this way, as illustrated in FIG. 10H, the first opening 10s that exposes a part of the first region 7s of the oxide semiconductor layer 7, and the second opening 10d that exposes a part of the second region 7d are formed in the interlayer insulating layer 10 in the TFT formation region r1. Further, by collectively etching the interlayer insulating layer 10 and the lower gate insulating layer 5, the wiring line contact hole CH1 that exposes a part of the upper connection section 8C and a part of the lower connection section 3C is formed in the connection section formation region r2.

The interlayer insulating layer 10 can be formed with a single-layer or a multi-layer of an inorganic insulating layer such as a silicon oxide film, a silicon nitride film, a silicon oxynitride film, a silicon nitride oxide film and the like. The thickness of the inorganic insulating layer may be from 100 nm to 500 nm. It is preferable to form the interlayer insulating layer 10 by using an insulating film that reduces an oxide semiconductor, such as a silicon nitride film, because the specific resistance of the regions, of the oxide semiconductor layer 7, that are in contact with the interlayer insulating layer 10 (here, the low-resistance regions) can be maintained to be low. Here, for example, a SiN layer (having the thickness of 300 nm) is formed as the interlayer insulating layer 10 by the CVD method.

When an insulating layer that can reduce an oxide semiconductor (a hydrogen donating layer such as a silicon nitride layer, for example) is used as the interlayer insulating layer 10, even when the above-mentioned resistance lowering processing is not performed, the resistance of the portion of the oxide semiconductor layer 7 that is in contact with the interlayer insulating layer 10 can be lowered compared to the portion that is not in contact with the interlayer insulating layer 10.

Note that when the gate wiring line connection section GC exemplified in FIG. 9B is formed, in this step, wiring line contact holes are formed that expose the lower connection section in the first metal layer M1 and the upper connection section in the second metal layer M2, respectively.

STEP 9: Forming Third Metal Layer M3 (FIG. 10I)

Subsequently, a third conductive film (having a thickness from 50 nm to 500 nm, for example) (not illustrated) is formed on the interlayer insulating layer 10, and the third conductive film is patterned. In this way, as illustrated in FIG. 10I, the third metal layer M3 including the source wiring line SL, the source electrode SE, the drain electrode DE, and the connection electrode 6C is formed. In this manner, the TFT 20 and the gate wiring line connection section GC are obtained.

The source electrode SE is disposed on the interlayer insulating layer 10 and in the first opening 10s, and is connected to the first region 7s of the oxide semiconductor layer 7 in the first opening 10s. The drain electrode DE is disposed on the interlayer insulating layer 10 and in the second opening 10d, and is connected to the second region 7d of the oxide semiconductor layer 7 in the second opening 10d. The connection electrode 6C is disposed on the interlayer insulating layer 10 and in the wiring line contact hole CH1, and is connected to the upper connection section 8C and the lower connection section 3C in the wiring line contact hole CH1.

As the third conductive film, for example, an element selected from aluminum (Al), chromium (Cr), copper (Cu), tantalum (Ta), titanium (Ti), molybdenum (Mo), and tungsten (W), or an alloy containing some of these elements can be used. For example, the third conductive film may have a triple-layer structure of titanium film-aluminum film-titanium film, or a triple-layer structure of molybdenum film-aluminum film-molybdenum film can be used. Note that the third conductive film is not limited to the triple-layer structure, and may have a single-layer or dual-layer structure, or a layered structure of four or more layers. Here, a layered film having a Ti film (having a thickness from 15 to 70 nm) as a lower layer and having a Cu film (having a thickness from 50 to 400 nm) as an upper layer is used. By using a layered film using an ohmic conductive film such as a Ti film as the bottom layer, a contact resistance of a source contact portion can be lowered more effectively.

STEP 10: Forming Inorganic Insulating Layer 11 and Organic Insulating Layer 12 (FIG. 10J)

Subsequently, as illustrated in FIG. 10J, the inorganic insulating layer 11 (having a thickness from 100 nm to 500 nm, for example) and the organic insulating layer 12 (having a thickness from 1 to 4 μm, and preferably from 2 to 3 μm, for example) are formed in this order so as to cover the interlayer insulating layer 10 and the third metal layer M3.

As the inorganic insulating layer 11, an inorganic insulating film similar to that of the interlayer insulating layer 10 can be used. Here, as the inorganic insulating layer 11, for example, an SiNx layer (having a thickness of 300 nm) is formed by the CVD method. The organic insulating layer 12 may be, for example, an organic insulating film containing a photosensitive resin material (for example, an acrylic resin film).

Thereafter, the organic insulating layer 12 is patterned. In this manner, in each of the pixel areas, an opening 12p that exposes a part of the inorganic insulating layer 11 is formed in the organic insulating layer 12. The opening 12p is disposed to overlap the drain electrode DE when viewed from the normal direction of the substrate 1. The entire portion of the organic insulating layer 12 positioned in the non-display region may be removed by this patterning.

STEP 11: Forming Common Electrode CE (FIG. 10K)

Subsequently, as illustrated in FIG. 10K, the common electrode CE is formed on the organic insulating layer 12.

First, a first transparent conductive film (having a thickness from 20 to 300 nm) (not illustrated) is formed on the organic insulating layer 12 and in the opening 12p. Here, for example, an indium-zinc oxide film is formed as the first transparent conductive film by a sputtering method. As a material of the first transparent conductive film, metal oxide such as indium-tin oxide (ITO), indium-zinc oxide, and ZnO can be used. Thereafter, the first transparent conductive film is patterned. In the patterning, wet etching may be performed using an oxalic acid-based etching solution, for example. This allows the common electrode CE to be obtained. The common electrode CE has, for example, the opening 15p over a region where the pixel contact hole is formed.

STEP 12: Forming Dielectric Layer 17 (FIG. 10L)

Subsequently, as illustrated in FIG. 10L, the dielectric layer (having a thickness from 50 to 500 nm) 17 is formed to cover the common electrode CE, and the dielectric layer 17 and the inorganic insulating layer 11 are patterned.

The dielectric layer 17 is formed on the organic insulating layer 12 and the common electrode CE and in the opening 12p in the pixel area. A material of the dielectric layer 17 may be the same as the material exemplified as the material of the inorganic insulating layer 11. Here, as the dielectric layer 17, for example, a SiN film is formed by the CVD method.

Thereafter, by the known photolithography step, etching of the dielectric layer 17 and the inorganic insulating layer 11 is performed, and the pixel contact hole CHp that exposes the drain electrode DE is thereby formed. In this example, the pixel contact hole CHp is constituted by the opening 17p of the dielectric layer 17, the opening 12p of the organic insulating layer 12, and the opening 11p of the inorganic insulating layer 11. The opening 17p may overlap at least partially the opening 12p when viewed from the normal direction of the substrate 1. The opening 11p is etched using a resist layer (not illustrated) on the dielectric layer 17 and the organic insulating layer 12 as a mask.

STEP 13: Forming Pixel Electrode PE (FIG. 10M)

Subsequently, a second transparent conductive film (having a thickness from 20 to 300 nm) (not illustrated) is formed on the dielectric layer 17 and in the pixel contact hole CHp. The second transparent conductive film can be formed using a material similar to that of the first transparent conductive film.

Thereafter, the second transparent conductive film is patterned. Here, for example, wet etching of the second transparent conductive film is performed by using an oxalic acid-based etching solution. In this way, as illustrated in FIG. 10M, the pixel electrode PE is formed in each of the pixel areas. The pixel electrode PE is connected to the drain electrode DE in the pixel contact hole CHp. In this manner, the active matrix substrate 101 is manufactured.

The structure and the manufacturing method of the active matrix substrate are not limited to the examples described above. The active matrix substrate according to the embodiment of the disclosure can be applied not only to liquid crystal display devices of the transverse electrical field mode such as the FFS mode and the In-Plane Switching (IPS) mode, but can also be applied to liquid crystal display devices of a vertical alignment mode (VA mode). Structures of such liquid crystal display devices are well-known, and description thereof will thus be omitted.

Oxide Semiconductor

The oxide semiconductor (also referred to as a metal oxide, or an oxide material) included in the oxide semiconductor layer of each TFT according to the present embodiment may be an amorphous oxide semiconductor or a crystalline oxide semiconductor including a crystalline portion. Examples of the crystalline oxide semiconductor include a polycrystalline oxide semiconductor, a microcrystalline oxide semiconductor, a crystalline oxide semiconductor having a c-axis oriented substantially perpendicular to the layer surface and the like.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. When the oxide semiconductor layer has a dual-layer structure that includes an upper layer and a lower layer, an energy gap of the oxide semiconductor included in a layer positioned on the gate electrode side of the two layers (that is, the lower layer in the case of the bottom gate structure, and the upper layer in the case of the top gate structure) may be smaller than an energy gap of the oxide semiconductor included in a layer positioned opposite from the gate electrode (that is, the upper layer in the case of the bottom gate structure, and the lower layer in the case of the top gate structure). However, when a difference in the energy gap between these layers is relatively small, the energy gap of the oxide semiconductor included in the layer positioned on the gate electrode side may be greater than the energy gap of the oxide semiconductor included in the layer positioned opposite from the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated in the present specification by reference.

The oxide semiconductor layer may include, for example, at least one metal element selected from In, Ga, and Zn. In the present embodiment, the oxide semiconductor layer includes, for example, an In—Ga—Zn—O-based semiconductor (for example, an indium gallium zinc oxide). Here, the In—Ga—Zn—O-based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, In:Ga:Zn=1:1:2 or the like. Such an oxide semiconductor layer can be formed of an oxide semiconductor film including an In—Ga—Zn—O-based semiconductor.

The In—Ga—Zn—O-based semiconductor may be an amorphous semiconductor or may be a crystalline semiconductor. A crystalline In—Ga—Zn—O-based semiconductor in which a c-axis is oriented substantially perpendicular to a layer surface is preferable as the crystalline In—Ga—Zn—O-based semiconductor.

Note that a crystal structure of the crystalline In—Ga—Zn—O-based semiconductor is disclosed, for example, in JP 2014-007399 A described above, JP 2012-134475 A, JP 2014-209727 A, and the like. The entire contents of the disclosures of JP 2012-134475 A and JP 2014-209727 A are incorporated in the present specification by reference. A TFT including an In—Ga—Zn—O-based semiconductor layer has a high mobility (more than 20 times as compared to an a-Si TFT) and a low leakage current (less than $1/100$ as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O-based semiconductor, the oxide semiconductor layer may include another oxide semiconductor. For example, the oxide semiconductor layer may include an In—Sn—Zn—O-based semiconductor (for example, $In_2O_3$—$SnO_2$—ZnO; InSnZnO). The In—Sn—Zn—O-based semiconductor is a ternary oxide of indium (In), tin (Sn), and zinc (Zn). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—

Ge—O-based semiconductor, a Cd—Pb—O-based semiconductor, cadmium oxide (CdO), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, an In—W—Zn—O-based semiconductor, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate including a display region including a plurality of pixel areas disposed in a matrix shape in a row direction and a column direction, the active matrix substrate comprising:
    a substrate;
    a plurality of oxide semiconductor TFTs supported on a main surface of the substrate and corresponding to the plurality of pixel areas, each of the plurality of oxide semiconductor TFTs including an oxide semiconductor layer, a lower gate electrode positioned on the substrate side of the oxide semiconductor layer and overlapping a part of the oxide semiconductor layer via a lower gate insulating layer, and an upper gate electrode positioned on the oxide semiconductor layer on a side opposite from the substrate and overlapping the part of the oxide semiconductor layer via an upper gate insulating layer;
    a plurality of source wiring lines extending in the column direction;
    a plurality of upper gate wiring lines extending in the row direction; and
    a plurality of lower gate wiring lines positioned between the plurality of upper gate wiring lines and the substrate and extending in the row direction,
    wherein the plurality of lower gate wiring lines include a first gate wiring line,
    the plurality of upper gate wiring lines include a second gate wiring line partially overlapping the first gate wiring line via the lower gate insulating layer and the upper gate insulating layer,
    the plurality of oxide semiconductor TFTs include a first TFT, the oxide semiconductor layer of the first TFT extending across the first gate wiring line and the second gate wiring line in the column direction, when viewed from a normal direction of the substrate, and portions of the first gate wiring line and the second gate wiring line, over which the oxide semiconductor layer of the first TFT extends, respectively functioning as the lower gate electrode and the upper gate electrode of the first TFT,
    when viewed from the normal direction of the substrate, the first gate wiring line includes a plurality of first notched portions disposed spaced apart from each other and a first solid portion, the first solid portion being a portion other than the plurality of first notched portions,
    when viewed from the normal direction of the substrate, the second gate wiring line includes a second solid portion including a plurality of first overlapping portions disposed spaced apart from each other, each of the first overlapping portions partially overlapping at least one of the plurality of first notched portions, and a second overlapping portion overlapping the first solid portion, when viewed from the normal direction of the substrate, the second overlapping portion continuously extends from one of two of the plurality of source wiring lines adjacent to each other, to the other of the two source wiring lines adjacent to each other, a voltage is applied to the lower gate electrode, the plurality of lower gate wiring lines are located between the plurality of upper gate wiring lines and the substrate in a direction parallel to the normal direction of the substrate, and the lower gate electrode and the plurality of lower gate wiring lines, including the first gate wiring line, are made of a first conductive film, and the upper gate electrode and the plurality of upper gate wiring lines, including the second gate wiring line, are made of a second conductive film different from the first conductive film.

2. The active matrix substrate according to claim 1,
wherein when viewed from the normal direction of the substrate, the oxide semiconductor layer of the first TFT extends across the column direction between two of the first notched portions adjacent to each other in the first gate wiring line.

3. The active matrix substrate according to claim 1,
wherein when viewed from the normal direction of the substrate, at least one of the plurality of first overlapping portions of the second gate wiring line includes a portion positioned between the two adjacent source wiring lines.

4. The active matrix substrate according to claim 1,
wherein when viewed from the normal direction of the substrate, the first solid portion of the first gate wiring line includes a first edge portion and a second edge portion extending in the row direction while facing each other, the second solid portion of the second gate wiring line includes a third edge portion and a fourth edge portion extending in the row direction while facing each other, the third edge portion of the second gate wiring line extends, in the row direction, across the plurality of first notched portions of the first gate wiring line, and the fourth edge portion extends, in the row direction, between the first edge portion and the second edge portion of the first gate wiring line, between the two adjacent source wiring lines.

5. The active matrix substrate according to claim 1,
wherein when viewed from the normal direction of the substrate, an edge portion of each of the first notched portions of the first gate wiring line includes an inclined portion extending in a direction intersecting the row direction and the column direction, the inclined portion intersecting an edge portion of the second solid portion of the second gate wiring line.

6. The active matrix substrate according to claim 1,
wherein when viewed from the normal direction of the substrate, a maximum length in the column direction of each of the first notched portions of the first gate wiring line is from ¼ to ¾ of a maximum width in the column direction of the first solid portion of the first gate wiring line.

7. The active matrix substrate according to claim 1,
wherein when viewed from the normal direction of the substrate, a length in the row direction of an interval between two of the first notched portions adjacent to each other of the first gate wiring line is greater than a channel width of the first TFT and no more than twice the channel width.

8. The active matrix substrate according to claim 1,
wherein between the two adjacent source wiring lines, a maximum width of the second solid portion of the second gate wiring line is smaller than a maximum width of the first solid portion of the first gate wiring line.

9. The active matrix substrate according to claim 1,
wherein when viewed from the normal direction of the substrate, the second gate wiring line further includes a plurality of second notched portions disposed spaced apart from each other, and a portion other than the plurality of second notched portions is the second solid portion.

10. The active matrix substrate according to claim 9,
wherein one of the plurality of second notched portions at least partially overlaps one of the plurality of first notched portions of the first gate wiring line.

11. The active matrix substrate according to claim 9,
wherein one of the plurality of second notched portions is adjacent, in the column direction, to one of the plurality of first notched portions of the first gate wiring line with the second overlapping portion interposed therebetween.

12. The active matrix substrate according to claim 9,
wherein when viewed from the normal direction of the substrate, the second solid portion of the second gate wiring line includes a third edge portion and a fourth edge portion extending in the row direction while facing each other, and when viewed from the normal direction of the substrate, the plurality of second notched portions include at least one notched portion positioned inside a recessed portion formed at the third edge portion, and at least one notched portion positioned inside a recessed portion formed at the fourth edge portion.

13. The active matrix substrate according to claim 1,
wherein when viewed from the normal direction of the substrate, the first solid portion of the first gate wiring line includes a first edge portion and a second edge portion extending in the row direction while facing each other, and when viewed from the normal direction of the substrate, each of the plurality of first notched portions is positioned inside a recessed portion formed at either one of the first edge portion or the second edge portion.

14. The active matrix substrate according to claim 13,
wherein when viewed from a normal direction of the substrate, the plurality of first notched portions include at least one notched portion positioned inside a recessed portion formed at the first edge portion, and at least one notched portion positioned inside a recessed portion formed at the second edge portion.

15. The active matrix substrate according to claim 1,
wherein the active matrix substrate further includes a non-display region positioned around the display region, the non-display region includes a plurality of gate wiring line connection sections supported on the substrate, and each of the gate wiring line connection sections electrically connects one of the plurality of lower gate wiring lines and one of the plurality of upper gate wiring lines.

16. The active matrix substrate according to claim 15,
wherein in each of the gate wiring line connection sections, one of the plurality of lower gate wiring lines and one of the plurality of upper gate wiring lines are electrically connected via a connection electrode formed in an upper layer overlying the plurality of upper gate wiring lines.

17. The active matrix substrate according to claim 15, wherein the plurality of gate wiring line connection sections include a pair of first gate wiring line connection sections electrically connecting the first gate wiring line and the second gate wiring line, and when viewed from a normal direction of the substrate, the pair of first gate wiring line connection sections are positioned respectively on both sides of the display region in the row direction.

18. The active matrix substrate according to claim 1, wherein the oxide semiconductor layer contains In, Ga, and Zn.

19. The active matrix substrate according to claim 18, wherein the oxide semiconductor layer includes an In—Ga—Zn—O-based oxide.

20. The active matrix substrate according to claim 19, wherein the In—Ga—Zn—O-based oxide includes a crystalline portion.

* * * * *